(12) United States Patent
Lu et al.

(10) Patent No.: US 10,388,598 B2
(45) Date of Patent: Aug. 20, 2019

(54) INTERPOSER, SEMICONDUCTOR PACKAGE STRUCTURE, AND SEMICONDUCTOR PROCESS

(71) Applicant: Advanced Semiconductor Engineering, Inc., Kaohsiung (TW)

(72) Inventors: Wen-Long Lu, Kaohsiung (TW); Min Lung Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/818,337

(22) Filed: Nov. 20, 2017

(65) Prior Publication Data

US 2018/0076122 A1     Mar. 15, 2018

Related U.S. Application Data

(62) Division of application No. 15/178,066, filed on Jun. 9, 2016, now Pat. No. 9,852,971.

(51) Int. Cl.
| | |
|---|---|
| *H01L 23/31* | (2006.01) |
| *H01L 23/498* | (2006.01) |
| *H01L 21/48* | (2006.01) |
| *H01L 21/683* | (2006.01) |

(52) U.S. Cl.
CPC ...... *H01L 23/49827* (2013.01); *H01L 21/486* (2013.01); *H01L 21/6835* (2013.01); *H01L 23/3157* (2013.01); *H01L 23/3128* (2013.01); *H01L 2221/68345* (2013.01); *H01L 2224/16225* (2013.01); *H01L 2224/73204* (2013.01); *H01L 2924/181* (2013.01)

(58) Field of Classification Search
CPC combination set(s) only.
See application file for complete search history.

(56) References Cited

U.S. PATENT DOCUMENTS

| | | | |
|---|---|---|---|
| 7,238,603 B2 | 7/2007 | Iijima et al. | |
| 9,111,902 B2 * | 8/2015 | Savastiouk | ......... H01L 21/4857 |
| 2003/0215619 A1 | 11/2003 | Ooi et al. | |

(Continued)

FOREIGN PATENT DOCUMENTS

| | | |
|---|---|---|
| CN | 1458815 A | 11/2003 |
| CN | 1669374 A | 9/2005 |

(Continued)

OTHER PUBLICATIONS

Office Action for corresponding Chinese Patent Application No. 201710324603.0, dated May 2, 2018, 11 pages.

(Continued)

*Primary Examiner* — Nathan W Ha
(74) *Attorney, Agent, or Firm* — Foley & Lardner LLP; Cliff Z. Liu

(57) ABSTRACT

A semiconductor process includes: (a) attaching a metal layer on a carrier; (b) removing a portion of the metal layer to form a through hole and at least one metal via, wherein the at least one metal via is disposed in the through hole, and the at least one metal via is separated from a side wall of the through hole by a space; and (c) forming a redistribution layer on the metal layer, wherein the redistribution layer is electrically connected to the at least one metal via.

19 Claims, 15 Drawing Sheets

(56) References Cited

U.S. PATENT DOCUMENTS

| | | |
|---|---|---|
| 2006/0071345 A1 | 4/2006 | Chiu et al. |
| 2006/0255440 A1 | 11/2006 | Miyazaki et al. |
| 2010/0163090 A1 | 7/2010 | Liu et al. |
| 2012/0305916 A1 | 12/2012 | Liu et al. |
| 2013/0082365 A1 | 4/2013 | Bernier et al. |
| 2014/0070423 A1 | 3/2014 | Woychik et al. |
| 2014/0117539 A1 | 5/2014 | Karasawa et al. |
| 2014/0346678 A1 | 11/2014 | Delacruz |
| 2015/0069627 A1 | 3/2015 | Kojima |
| 2015/0214191 A1 | 7/2015 | Lee et al. |
| 2015/0325508 A1 | 11/2015 | Chen et al. |
| 2015/0325556 A1 | 11/2015 | Lai et al. |
| 2016/0172288 A1 | 6/2016 | Audet et al. |

FOREIGN PATENT DOCUMENTS

| | | |
|---|---|---|
| CN | 1913142 A | 2/2007 |
| JP | H01-276791 A | 11/1989 |
| JP | H07-176835 A | 7/1995 |
| JP | 2001-298123 A | 10/2001 |
| JP | 2002-223071 A | 8/2002 |
| JP | 2006-041448 A | 2/2006 |
| JP | 2007-180083 A | 7/2007 |
| JP | 2008-153400 A | 7/2008 |
| JP | 2009-147241 A | 7/2009 |

OTHER PUBLICATIONS

Search Report for corresponding Chinese Patent Application No. 2017103246030.0, issued with Office Action dated May 2, 2018, 6 pages.

Non-Final Office Action for U.S. Appl. No. 15/178,066, dated Mar. 17, 2017.

Notice of Allowance for U.S. Appl. No. 15/178,066, dated Aug. 22, 2017.

* cited by examiner

US 10,388,598 B2

INTERPOSER, SEMICONDUCTOR PACKAGE STRUCTURE, AND SEMICONDUCTOR PROCESS

CROSS-REFERENCE TO RELATED APPLICATION

This application is a divisional of U.S. patent application Ser. No. 15/178,066, filed Jun. 9, 2016, the content of which is incorporated herein by reference in its entirety.

BACKGROUND

1. Field of the Disclosure

The present disclosure relates to an interposer, a semiconductor package structure, and a semiconductor process, and more particularly to an interposer with a metal layer, a semiconductor package structure including the same, and a semiconductor process for manufacturing the same.

2. Description of the Related Art

A conventional semiconductor package structure includes an interposer with conductive through vias to electrically connect a high density redistribution layer (RDL) and a low density RDL. A material of the conventional interposer may be silicon or an organic material. A conventional silicon interposer has disadvantages that include high cost and complicated manufacturing. A conventional organic interposer has disadvantages that include a coefficient of thermal expansion (CTE) different from CTEs of conductive through vias and a circuit layer, thus, undesired warpage of the conventional organic interposer can occur. In addition, the distribution density of the conductive through vias of the conventional interposer is limited.

SUMMARY

In an aspect, an interposer includes an interconnection structure and a redistribution layer. The interconnection structure includes a metal layer, at least one metal via and an isolation material. The metal layer defines at least one through hole having a side wall. The at least one metal via is disposed in the through hole. A space is defined between the at least one metal via and the side wall of the through hole, and the isolation material fills the space. The redistribution layer is disposed on a surface of the interconnection structure and is electrically connected to the metal via.

In an aspect, a semiconductor package structure includes an interposer and a semiconductor die disposed on and electrically connected to the interposer. The interposer includes an interconnection structure, and the interconnection structure includes a metal layer, a metal via and an isolation material. The metal layer defines a through hole having a side wall. The metal via is disposed in the through hole. The isolation material fills a space between the metal via and the side wall of the through hole.

In an aspect, a semiconductor process includes (a) attaching a metal layer on a carrier; (b) removing a portion of the metal layer to form a through hole and at least one metal via; and (c) forming a redistribution layer on the metal layer, wherein the redistribution layer is electrically connected to the at least one metal via. The at least one metal via is disposed in the through hole, and the at least one metal via is separated from a side wall of the through hole by a space.

DETAILED DESCRIPTION

Figure 1:
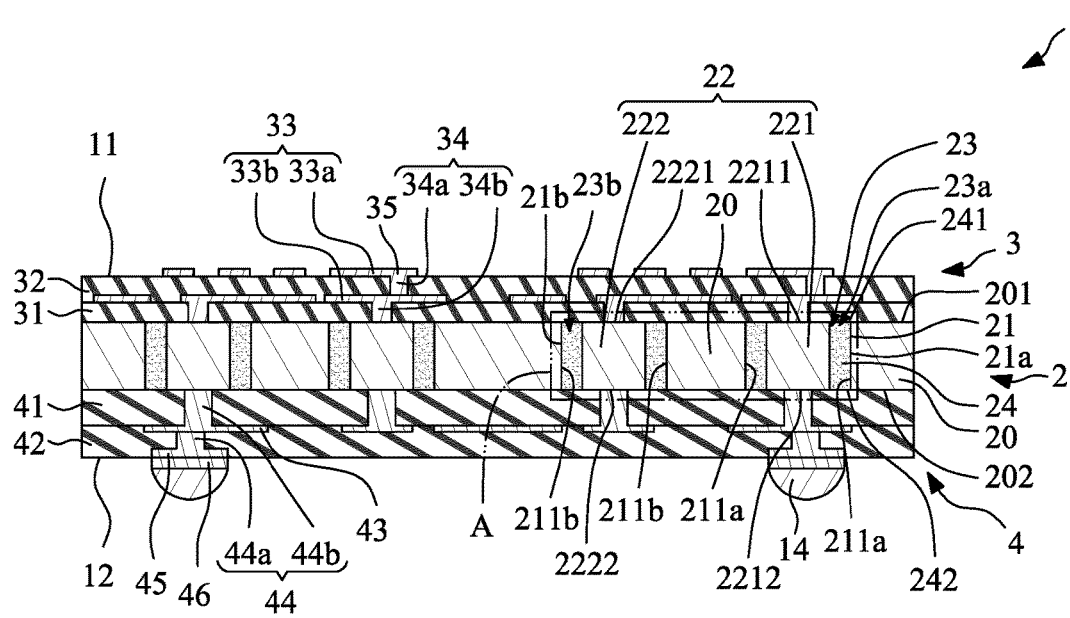
FIG. 1 illustrates a cross-sectional view of an interposer according to an embodiment of the present disclosure.

As noted, one kind of a conventional interposer is an organic interposer with conductive through vias and at least one circuit layer. The materials of the conductive through via and the circuit layer are metal. A mismatch of a CTE of the organic interposer body and CTEs of the conductive through via and the circuit layer may distort (warp) the organic interposer, which can affect the integrity of the organic interposer, and make handling and assembly more difficult. In addition, a structural strength of the organic interposer is relatively low, and a thickness of the organic interposer is correspondingly relatively large (e g, greater than about 25 micrometers (µm)).

In a conventional manufacturing process for making an organic interposer, a seed layer is formed on a base material (carrier) and an organic insulation material is formed on the seed layer. Openings are formed in the organic insulation material to expose portions of the seed layer. The openings are plated and filled with metal to form conductive through vias, and an RDL is formed on the surface of the organic insulation material. Then, the seed layer and the base material are removed. Disadvantages of such a manufacturing process include the following. First, a surface condition of a surface of the base material (carrier) will influence a surface condition of a surface of the conductive through vias and a surface of the RDL, and will further influence the formation of RDL structure and electrical connection quality. Therefore, manufacturing tolerances related to the base material (carrier) are stringent (e.g., a total thickness variation (TTV)

less than 5 μm, and uniformity less than 3%), especially when manufacturing a fine pitch circuit (e.g., a line width/line space (L/S) less than 7/7 μm). Second, the use of the seed layer complicates the conventional manufacturing process and increases the manufacturing cost.

In a conventional manufacturing process for making a conventional silicon (Si) interposer, openings are formed in the Si interposer (e.g., by laser drilling or etching) and an isolation layer is formed in each opening such that a central cavity is defined in each opening. The central cavity is plated by a conductive material to form a conductive through via. Then, an RDL is formed on the Si interposer. Disadvantages of such a manufacturing process include that it is a complicated process and the manufacturing cost is high. In addition, for fine L/S circuitry, a cost of forming the openings in the Si interposer (e.g., by laser drilling) increases.

In the above two conventional processes for making an interposer, dimpling can occur at the end of the conductive through via during the plating stage, especially for high aspect ratio through vias (e.g., greater than 10:1), which can result in an open circuit between the through via and a connection point of a device to which the interposer is later connected. To address the dimpling, the interposer may be thinned to remove a top portion and/or a bottom portion of the interposer including the dimple. However, such thinning will increase the manufacturing cost.

To address the above concerns, the present disclosure provides an improved interposer structure, and improved techniques for manufacturing the interposer structure, in which a main body of the interposer is metal, which reduces warpage, such as warpage that could occur during thermal treatment for forming an RDL structure. The benefits of the techniques of the present disclosure are especially pronounced for via structures having an L/S less than about 7/7 μm. Further, because the main body of the interposer is metal, which has a relatively high structural strength as compared to silicon or organic interposers, the interposer can be relatively thin as compared to silicon or organic interposers. In addition, conductive through vias are formed by etching the main body rather than by plating, thus, manufacturing is simplified and manufacturing cost is relatively low. The use of etching also provides for improved manufacturing tolerances related to the main body (e.g., TTV and uniformity) as compared to the use of plating, further reducing manufacturing complexity and cost.

FIG. 1 illustrates a cross-sectional view of an interposer 1 according to an embodiment of the present disclosure. The interposer 1 has a first surface 11 and a second surface 12 opposite the first surface 11. The interposer 1 includes an interconnection structure 2, at least one redistribution layer (RDL) (e.g., a first RDL 3 and a second RDL 4) and at least one external connection element 14.

The interconnection structure 2 has a first surface 201 and a second surface 202 opposite the first surface 201. The interconnection structure 2 includes a metal layer 20 (the interposer body), at least one metal via 22 (e.g., a first metal via 221 and a second metal via 222) and an isolation material 24. A first surface of the metal layer 20 is along (is a portion of) the first surface 201 of the interconnection structure 2, and a second surface of the metal layer 20 is along (is a portion of) the second surface 202 of the interconnection structure 2. The metal layer 20 defines at least one through hole 21 (e.g., a first through hole 21a and a second through hole 21b). The material of the metal layer 20 is copper, another metal or metal alloy, or other conductive material. The first through hole 21a has a side wall 211a, and the second through hole 21b has a side wall 211b. The through holes 21 (e.g., the first through hole 21a and the second through hole 21b) extend through the metal layer 20, that is, extend from the first surface 201 to the second surface 202.

The metal vias 22 are disposed in respective through holes 21. A space 23 (e.g., a first space 23a and a second space 23b) is present between each metal via 22 and a corresponding side wall 211a or 211b of the respective through hole 21. That is, the first metal via 221 is disposed in the first through hole 21a, and the first space 23a is between the first metal via 221 and the side wall 211a of the first through hole 21a. Similarly, the second metal via 222 is disposed in the second through hole 21b, and the second space 23b is between the second metal via 222 and the side wall 211b of the second through hole 21b.

As noted, the first surface of the metal layer 20 is along (is a portion of) the first surface 201 of the interconnection structure 2. A first surface 2211 of the first metal via 221 and a first surface 2221 of the second metal via 222 are also along (are portions of) the first surface 201 of the interconnection structure 2. As noted, the second surface of the metal layer 20 is along (is a portion of) the second surface 202 of the interconnection structure 2. A second surface 2212 of the first metal via 221 and a second surface 2222 of the second metal via 222 are also along (are portions of) the second surface 202 of the interconnection structure 2. In some embodiments, the first surfaces 2211, 2221 of the metal vias 22 (e.g., respectively the first metal via 221 and the second metal via 222) are substantially coplanar with the first surface 201 of the interconnection structure 2 (and the metal layer 20), and the second surfaces 2212, 2222 of the metal vias 22 (e.g., respectively the first metal via 221 and the second metal via 222) are substantially coplanar with the second surface 202 of the interconnection structure 2 (and the metal layer 20)

In one or more embodiments, the metal vias 22 (e.g., the first metal via 221 and the second metal via 222) are formed by etching the metal layer 20; thus, the metal layer 20 and the metal vias 22 are, or include, a same material. In such embodiments, the first surfaces 2211, 2221 of the metal vias 22 are substantially coplanar with the first surface 201 of the interconnection structure 2, and the second surfaces 2212, 2222 of the metal vias 22 are substantially coplanar with the second surface 202 of the interconnection structure 2. In one or more embodiments, both the metal layer 20 and the metal vias 22 are copper.

The isolation material 24 fills the spaces 23 (e.g., the first space 23a and the second space 23b) to prevent the metal vias 22 from being electrically connected to the metal layer 20. Examples of materials that may be used for the isolation material 24 include a solder mask, a material that is photosensitive when applied, a polyimide, another polymer, or other material or combination of materials. A first surface 241 of the isolation material 24 is substantially coplanar with the first surface 201 of the interconnection structure 2 (and the metal layer 20), and a second surface 242 of the isolation material 24 is substantially coplanar with the second surface 202 of the interconnection structure 2 (and the metal layer 20).

The first RDL 3 is disposed on the first surface 201 of the interconnection structure 2, and the second RDL 4 is disposed on the second surface 202 of the interconnection structure 2. The first RDL 3 is electrically connected to the second RDL 4 by way of the metal vias 22. In the embodiment illustrated in FIG. 1, the first RDL 3 is a relatively high density redistribution layer, and the second RDL 4 is a relatively low density redistribution layer. That is, a number of input or output connections (I/O counts) provided by the first RDL 3 can be greater than the I/O counts provided by the second RDL 4. For example, the first RDL 3 can have I/O counts in the several hundreds of thousands, whereas the second RDL 4 may have a same or fewer I/O counts, such as I/O counts in the several tens of thousands. In other words, a ratio of I/O counts for the first RDL 3 to I/O counts for the second RDL 4 may be equal to or greater than one, such as greater than about five, greater than about ten, greater than about twenty, or greater than about fifty.

In one or more embodiments, the first RDL 3 and the second RDL 4 may be electrically connected to the metal layer 20, such as, for example, to provide a grounding path.

In one or more embodiments, the second RDL 4 can be omitted, and the second surfaces 2212/2222 of the metal vias 221/222 may be used as external terminals.

In the embodiment illustrated in FIG. 1, the first RDL 3 includes one or more insulation layers (e.g., a first insulation layer 31 and a second insulation layer 32), one or more circuit layers 33 (e.g., circuit layers 33a, 33b), one or more interconnection vias 34 (e.g., interconnection vias 34a, 34b) and one or more first pads 35. The first insulation layer 31 is disposed on the first surface 201 of the interconnection structure 2, and the second insulation layer 32 is disposed on the first insulation layer 31. A material of the second insulation layer 32 may be the same as or different from a material of the first insulation layer 31. Examples of materials that may be used for the first insulation layer 31 or the second insulation layer 32 include a solder mask, a material that is photosensitive when applied, a polyimide, another polymer, or other material or combination of materials.

In one or more embodiments, the material of the first insulation layer 31 is the same as the material of the isolation material 24, and both are formed concurrently. That is, the first insulation layer 31 extends into the spaces 23 (e.g., the first space 23a and the second space 23b) to form the isolation material 24 of the interconnection structure 2.

In the embodiment of FIG. 1, two circuit layers 33 are shown: the circuit layer 33a disposed on a surface of the second insulation layer 32, and the circuit layer 33b disposed on a surface of the first insulation layer 31 and embedded at a surface of the second insulation layer 32. In other embodiments, one of the two circuit layers 33 may be omitted, or additional circuit layers 33 may be added (with corresponding additional insulation layers).

In one or more embodiments, a line width/line space (L/S) of the circuit layer 33a is less than about 7 μm/about 7 μm, for example, about 5 μm/about 5 μm or about 2 μm/about 2 μm. In one or more embodiments, the L/S of circuit layer 33b is also less than about 7 μm/about 7 μm. In embodiments in which the first RDL 3 includes additional circuit layers 33, an uppermost circuit layer 33 in the orientation shown (e.g., the farthest away from the first insulation layer 31, which may be exposed at the first surface 11 of the interposer 1) has an L/S less than about 7 μm/about 7 μm, for example, about 5 μm/about 5 μm or about 2 μm/about 2 μm; and others of the circuit layers 33 may have similar L/S values.

In the embodiment illustrated in FIG. 1, two groups of interconnection vias 34 are shown: a group of interconnection vias 34a extending between the circuit layer 33a and the circuit layer 33b, and a group of interconnection vias 34b extending between the circuit layer 33b and the metal vias 22 (e.g., the first metal via 221 and the second metal via 222). For embodiments with additional circuit layers 33 (and corresponding additional insulation layers), additional groups of interconnection vias 34 may be included for connection between the circuit layers 33 (through the additional insulation layers).

The first pads 35 are included in the uppermost circuit layer 33 that is exposed at the first surface 11 of the interposer 1 (e.g., the circuit layer 33a in the illustration of FIG. 1). The first pads 35 provided input and output connections, and the number of first pads 35 is the available I/O count for the first RDL 3 of the interposer 1.

In the embodiment illustrated in FIG. 1, the second RDL 4 includes one or more insulation layers (e.g., a first insulation layer 41 and a second insulation layer 42), one or more circuit layers 43, one or more interconnection vias 44 (e.g., interconnection vias 44a, 44b) and one or more second pads 45. The first insulation layer 41 is disposed on the second surface 202 of the interconnection structure 2, and the second insulation layer 42 is disposed on the first insulation layer 41. A material of the second insulation layer 42 may be the same as or different from a material of the first insulation layer 41. Examples of materials that may be used for the first insulation layer 41 or the second insulation layer 42 include a solder mask, a material that is photosensitive when applied, a polyimide, another polymer, or other material or combination of materials.

In one or more embodiments, the material of the first insulation layer 41 is same as a material of the isolation material 24, and both are formed concurrently. That is, the first insulation layer 41 extends into the spaces 23 (e.g., the first space 23a and the second space 23b) to form the isolation material 24 of the interconnection structure 2.

In the embodiment of FIG. 1, there is one circuit layer 43 disposed on a surface of the first insulation layer 41 and embedded at a surface of the second insulation layer 42. In one or more embodiments, the second RDL 4 may include additional circuit layers 43 (and may further include additional insulation layers). In one or more embodiments, an L/S of the circuit layer 43 (or any one or more of additional circuit layers if applicable) is less than about 7 μm/about 7 μm, for example, about 5 μm/about 5 μm or about 2 μm/about 2 μm.

In the embodiment illustrated in FIG. 1, two groups of interconnection vias 44 are shown: a group of interconnection vias 44a extending between the circuit layer 43 and the second pads 45, and a group of interconnection vias 44b extending between the circuit layer 43 and the metal vias 22 (e.g., the first metal via 221 and the second metal via 222). For embodiments with additional circuit layers 43 (and possibly additional insulation layers), additional groups of interconnection vias 44 may be included for connection between the circuit layers 43 (e.g., through the additional insulation layers).

The second pads 45 are embedded in the second insulation layer 42 and are exposed by the second surface 12 of the interposer 1. The second pads 45 provided input and output connections, and the number of second pads 45 is the available I/O count for the second RDL 4 of the interposer 1.

A surface finish layer 46 (e.g., an electroless nickel immersion gold (ENIG)) is optionally plated on the second pads 45. The external connection elements 14, such as solder balls or bumps, are disposed on the second pads 45 or on the surface finish layer 46.

In the embodiment illustrated in FIG. 1, the main body (the metal layer 20) of the interposer 1 is metal, which reduces occurrences of warpage during thermal treatment for forming the RDL structures (e.g., the first RDL 3 and the second RDL 4), which is especially pronounced when the L/S of the circuit layers 33, 43 is each less than about 7/about 7 μm. Further, because the main body of the interposer 1 is metal, which has a relatively high structural strength, a thickness of the interposer 1 can be reduced. In addition, the metal vias 22 (e.g., the first metal via 221 and the second metal via 222) can be formed by etching the main body (the metal layer 20) rather than plating, so that the manufacturing complexity and cost can be reduced. In addition, before being etched, the first surface 201 and the second surface 202 of the metal layer 20 have excellent uniformity (e.g., uniformity less than about 3% and TTV less than about 5 µm), and etching will not influence such uniformity. Accordingly, after being etched, the first surface 201 and the second surface 202 of the metal layer 20, and the first surfaces 2211, 2221 and the second surfaces 2212, 2222 of the metal vias 22 retain the excellent uniformity (e.g., uniformity less than about 3% and TTV less than about 5 µm). That is, after etching, the first surfaces 2211, 2221 of the metal vias 22 are substantially coplanar with the first surface 201 of the metal layer 20, and the second surfaces 2212, 2222 of the metal vias 22 are substantially coplanar with the second surface 202 of the metal layer 20. Therefore, the first RDL 3 and the second RDL 4 are formed on even or smooth surfaces (the first surface 201 and the second surface 202, respectively), which results in high yield. In comparison, conductive through vias formed by plating result in poor uniformity (e.g., uniformity greater than 10%) on the surfaces thereof, so that yield is low when forming the RDL structure on uneven conductive through vias surfaces.

Figure 2:
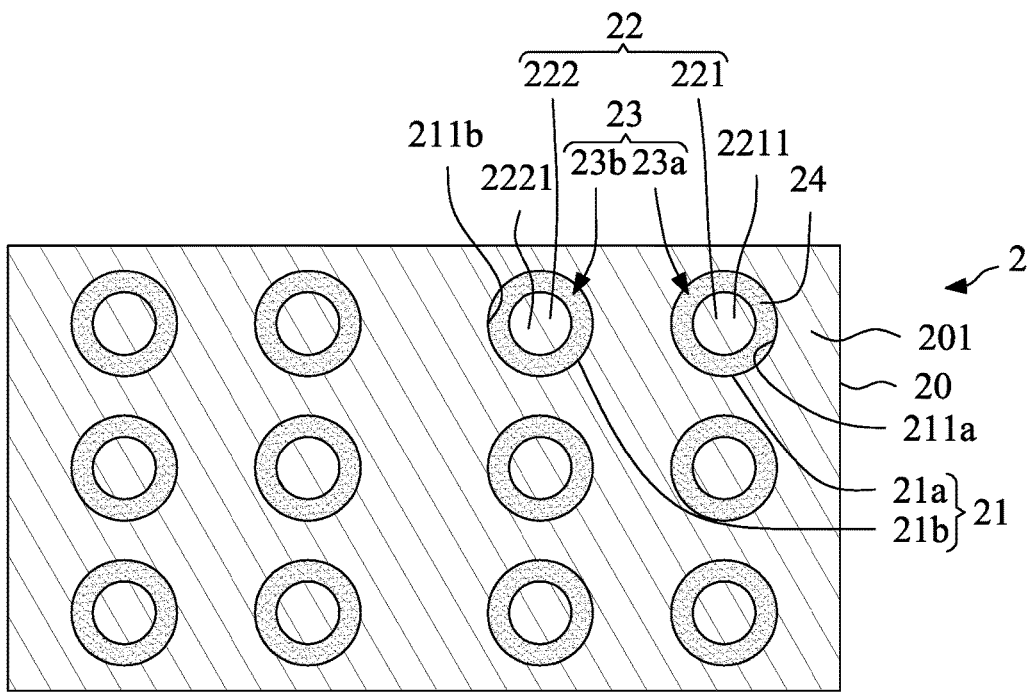
FIG. 2 illustrates a top view of an interconnection structure of FIG. 1 according to an embodiment of the present disclosure.

FIG. 2 illustrates a top view of the interconnection structure 2 of FIG. 1 viewed at the first surface 201 according to an embodiment of the present disclosure. A shape of the interconnection structure 2 in FIG. 2 is rectangular from the top view. The through holes 21 (e.g., the first through hole 21a and the second through hole 21b) of the metal layer 20 may be rectangular, square, circular, elliptical or other shape from the top view, and the metal vias 22 (e.g., the first metal via 221 and the second metal via 222) may be rectangular, square, circular, elliptical or other shape from the top view. As illustrated in FIG. 2, the shapes of the individual metal vias 22 may match the shapes of the corresponding through holes 21, and in FIG. 2, both are circular. In other embodiments, the shapes of the individual metal vias 22 do not necessarily match the shapes of the corresponding through holes 21.

A single metal via 22 is disposed in a corresponding through hole 21, thus, each space 23 (e.g., the first space 23a and the second space 23b) surrounds a metal via 22. In the embodiment of FIG. 2, the first space 23a is ring-shaped, surrounds the first metal via 221 and is filled with the isolation material 24 to prevent the first metal via 221 from contacting or electrically connecting to the side wall 211a of the first through hole 21a. In the embodiment of FIG. 2, the second space 23b is ring-shaped, surrounds the second metal via 222 and is filled with the isolation material 24 to prevent the second metal via 222 from contacting or electrically connecting to the side wall 211b of the second through hole 21b.

Figure 3:
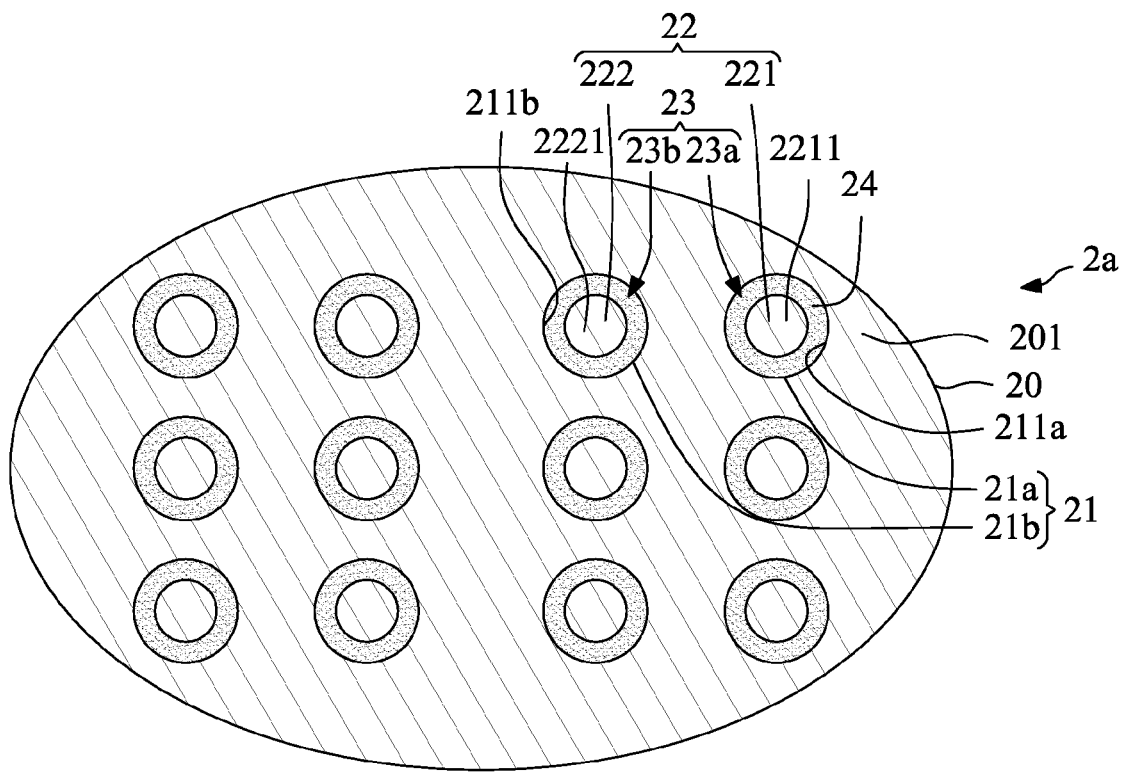
FIG. 3 illustrates a top view of an interconnection structure according to an embodiment of the present disclosure.

FIG. 3 illustrates a top view of an interconnection structure 2a according to an embodiment of the present disclosure. The interconnection structure 2a of FIG. 3 is similar to the interconnection structure 2 in FIG. 2, except that, instead of the rectangular shape of the interconnection structure 2 in FIG. 2, the shape of the interconnection structure 2a is elliptical from the top view. It should be understood that "rectangular" is inclusive of square and "elliptical" is inclusive of circular, and that shapes other than rectangular or elliptical are encompassed by the present disclosure.

Figure 4:
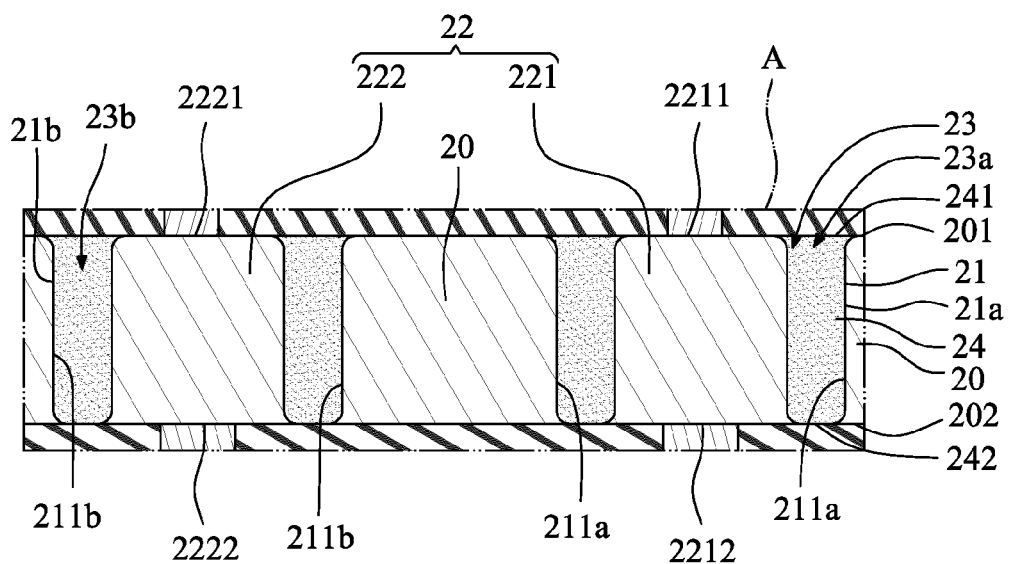
FIG. 4 illustrates an enlarged view of an area 'A' of FIG. 1 according to an embodiment of the present disclosure.

FIG. 4 illustrates an enlarged view of an area 'A' of FIG. 1 according to an embodiment of the present disclosure.

When the metal vias 22 (e.g., the first metal via 221 and the second metal via 222) are formed by etching, the metal vias 22 curve inward to the respective first surfaces 2211/2221 and curve outward to the respective second surfaces 2212/2222 as shown. The profile of the metal vias 22 of FIG. 4 is formed by under-etching. It is noted that the cross section of the portion of the metal layer 20 between two metal vias 22 will have a similar profile to the metal vias 22.

Figure 5:
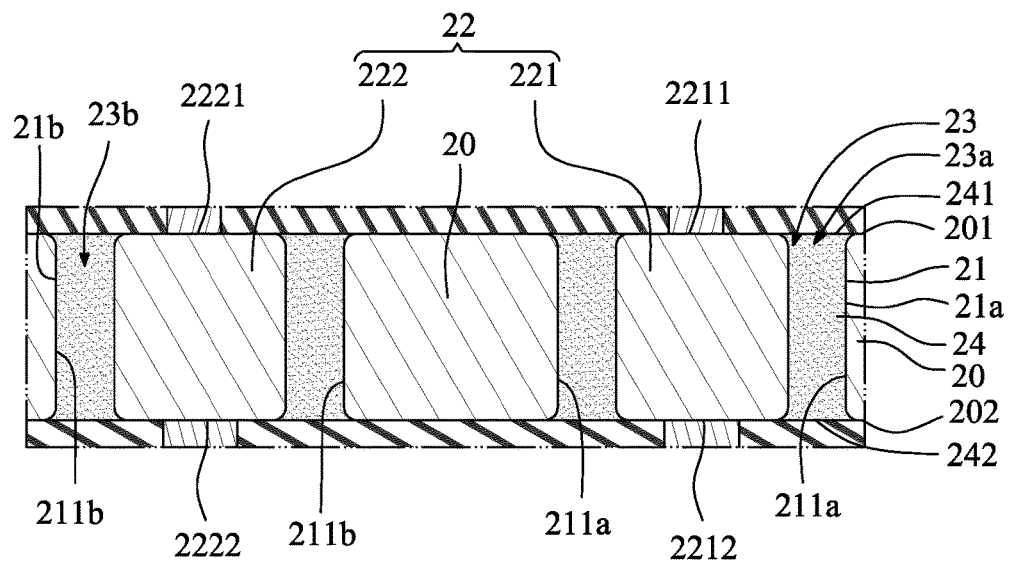
FIG. 5 illustrates an enlarged view of metal vias according to an embodiment of the present disclosure.

FIG. 5 illustrates an enlarged view of metal vias 22 according to an embodiment of the present disclosure. The metal vias 22 of FIG. 5 are similar to the metal vias 22 as shown in FIG. 4, except that the metal vias 22 curve inward (rather than outward) to the respective second surfaces 2212/2222 as shown. The profile of the metal vias 22 of FIG. 5 is formed by over-etching.

Figure 6:
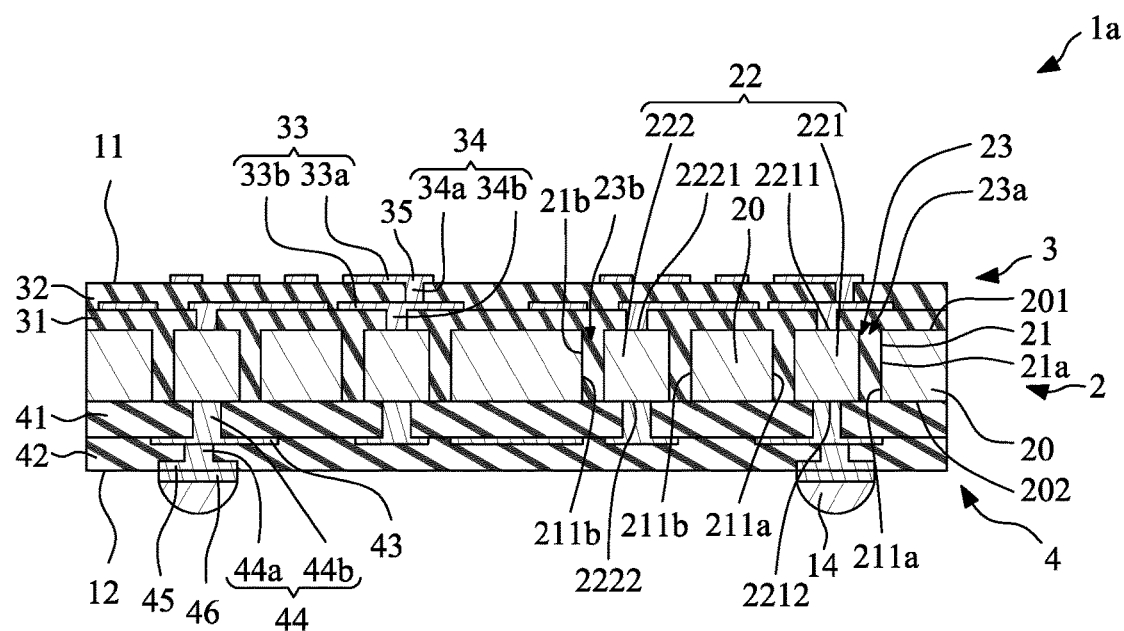
FIG. 6 illustrates a cross-sectional view of an interposer according to an embodiment of the present disclosure.

FIG. 6 illustrates a cross-sectional view of an interposer 1a according to an embodiment of the present disclosure. The interposer 1a of FIG. 6 is similar to the interposer 1 in FIG. 1, except that the first insulation layer 31 extends into and fills the space 23 (e.g., the first space 23a and the second space 23b) to form the isolation material 24 between the metal vias 22 and the side walls 211a, 211b of the through holes 21. That is, the material of the first insulation layer 31 is same as the material of the isolation material 24, and both are formed concurrently.

Figure 7:
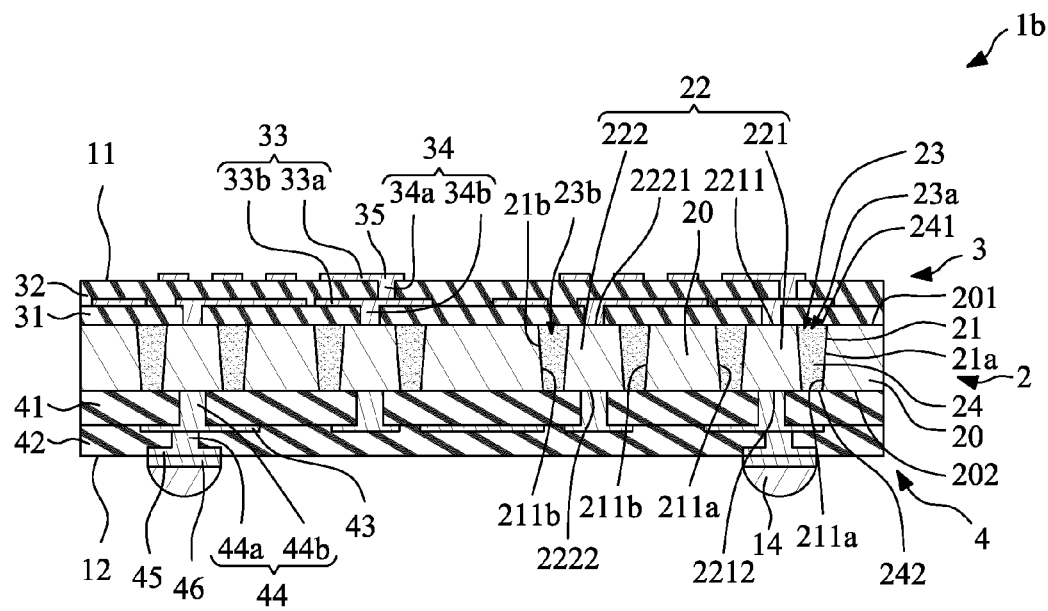
FIG. 7 illustrates a cross-sectional view of an interposer according to an embodiment of the present disclosure.

FIG. 7 illustrates a cross-sectional view of an interposer 1b according to an embodiment of the present disclosure. The interposer 1b of FIG. 7 is similar to the interposer 1 in FIG. 1, except for the profile of the metal vias 22 (e.g., the first metal via 221 and the second metal via 222). Because the metal vias 22 are formed by etching, each of the metal vias 22 tapers. That is, a dimension (e.g., diameter or width) of each metal via 22 at the first surface 2211 or 2221 is greater than a dimension (e.g., diameter or width) of each metal via 22 at the second surface 2212 or 2222.

Figure 8:
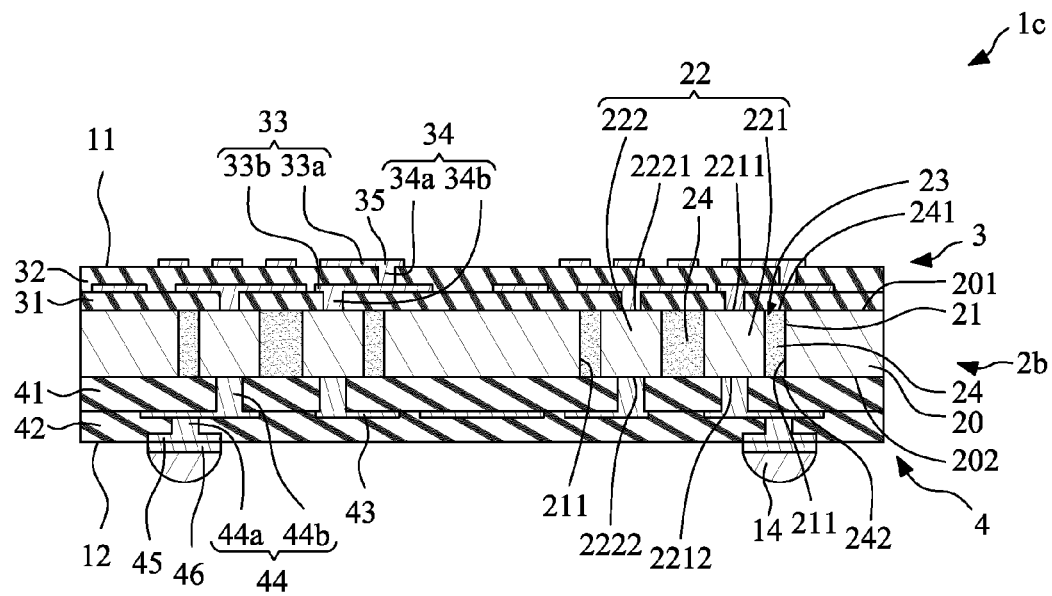
FIG. 8 illustrates a cross-sectional view of an interposer according to an embodiment of the present disclosure.

FIG. 8 illustrates a cross-sectional view of an interposer 1c according to an embodiment of the present disclosure. The interposer 1c of FIG. 8 is similar to the interposer 1 in FIG. 1, except for a structure of the interconnection structure 2b. In the interconnection structure 2b, multiple metal vias 22 are disposed in a single through hole 21, and the metal vias 22 are spaced apart from each other. In FIG. 8, the first metal via 221 and the second metal via 222 are disposed in the through hole 21, and a portion of the isolation material 24 is between the first metal via 221 and the second metal via 222. That is, there is no portion of the metal layer 20 between the first metal via 221 and the second metal via 222.

Figure 9:
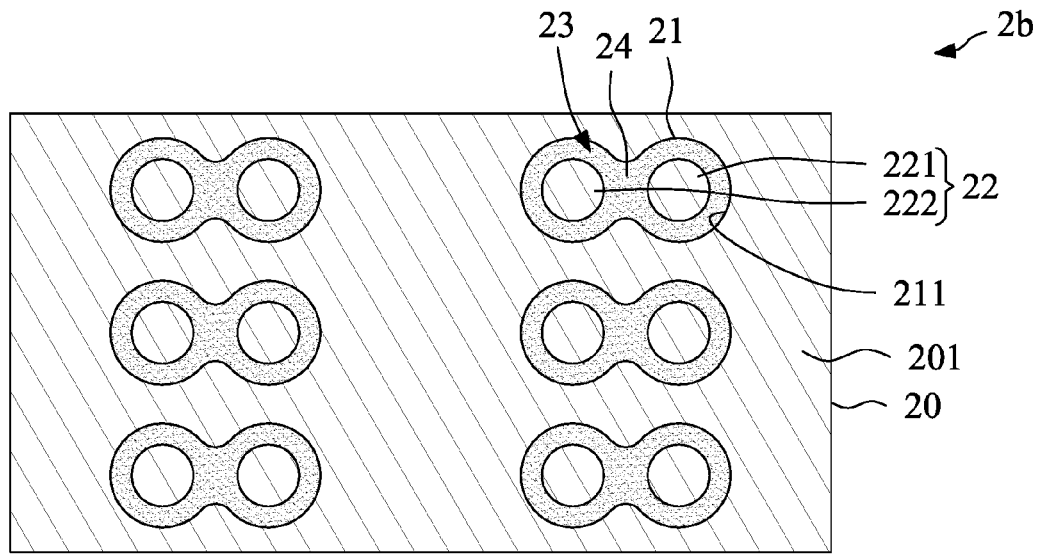
FIG. 9 illustrates a top view of an interconnection structure of FIG. 8 according to an embodiment of the present disclosure.

FIG. 9 illustrates a top view of the interconnection structure 2b of FIG. 8 according to an embodiment of the present disclosure. As shown in FIG. 9, the first metal via 221 and the second metal via 222 are both disposed within the through hole 21. Before the isolation material 24 is applied, there is empty space 23 between the first metal via 221 and the second metal via 222. After the isolation material 24 is applied, there is the isolation material 24 between the first metal via 221 and the second metal via 222. A pitch between the first metal via 221 and the second metal via 222 in FIG. 8 and FIG. 9 is less than a pitch between the first metal via 221 and the second metal via 222 in FIG. 1 and FIG. 2. It is to be understood that there may be more than two metal vias 22 disposed within a single through hole 21.

Figure 10:
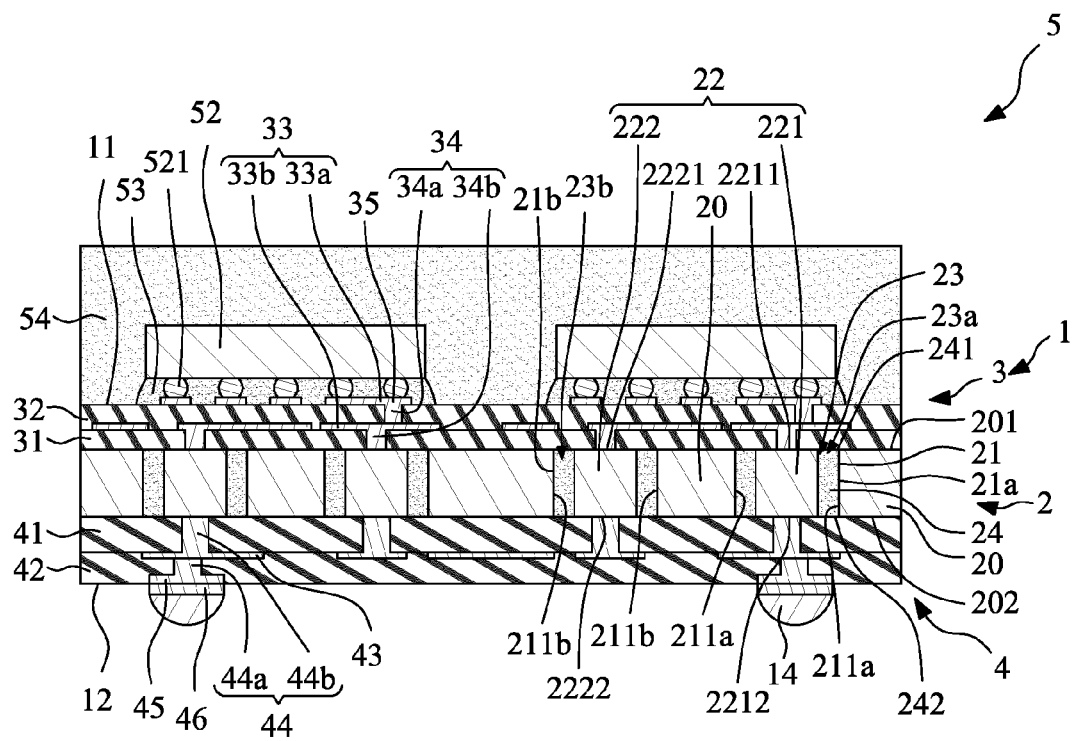
FIG. 10 illustrates a cross-sectional view of a semiconductor package structure according to an embodiment of the present disclosure.

FIG. 10 illustrates a cross-sectional view of a semiconductor package structure 5 according to an embodiment of the present disclosure. The semiconductor package structure 5 includes an interposer 1, at least one semiconductor die 52, an underfill 53 and an encapsulant 54. The interposer 1 of the embodiment illustrated in FIG. 10 is the interposer 1 of FIG.

1. The semiconductor die 52 is disposed on and electrically connected to the first RDL 3 of the interposer 1. In the embodiment illustrated in FIG. 10, the semiconductor die 52 includes connection elements 521 disposed on and electrically connected to the first pads 35 included in the uppermost circuit layer 33 (e.g., the circuit layer 33a) that is disposed at the first surface 11 of the interposer 1. The connection elements 521 may be solder balls, bumps or pillars. In other embodiments, the semiconductor die 52 may be electrically connected to the first RDL 3 by wire bonding. The underfill 53 surrounds the connection elements 521 and fills under the semiconductor die 52. The encapsulant 54 (e.g., a molding compound) covers the semiconductor die 52, the underfill 53 and the first surface 11 of the interposer 1. It is noted that the underfill 53 may be omitted, and the encapsulant 54 may further surround the connection elements 521 and fill under the semiconductor die 52. In addition, the interposer 1 of the embodiment illustrated in FIG. 10 may be replaced by the interposer 1a of FIG. 6, the interposer 1b of FIG. 7 or the interposer 1c of FIG. 8.

Figure 11:
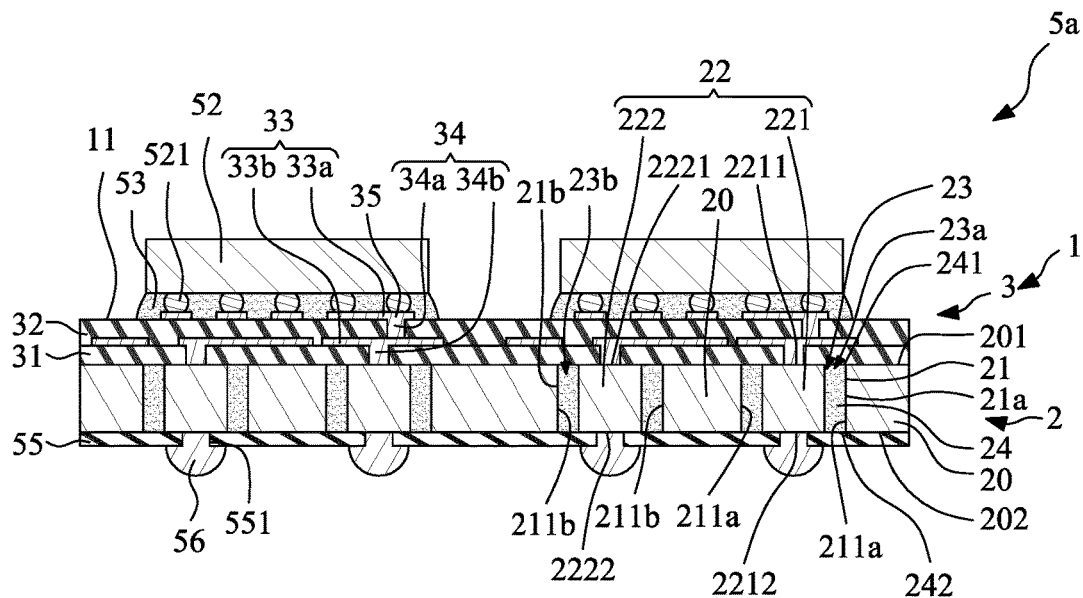
FIG. 11 illustrates a cross-sectional view of a semiconductor package structure according to an embodiment of the present disclosure.

FIG. 11 illustrates a cross-sectional view of a semiconductor package structure 5a according to an embodiment of the present disclosure. The semiconductor package structure 5a of FIG. 11 is similar to the semiconductor package structure 5 as shown in FIG. 10, except that the encapsulant 54 and the second RDL 4 are omitted, and the semiconductor package structure 5a includes a protection layer 55 and external connection elements 56 (e.g., solder balls or bumps). The protection layer 55 may include, for example, a solder mask or a passivation layer. The protection layer 55 is disposed on the second surface 202 of the interconnection structure 2, and defines openings 551 exposing the second surfaces 2212, 2222 of the metal vias 22 (e.g., respectively the first metal via 221 and the second metal via 222). The external connection elements 56 are disposed in the openings 551 to contact the second surfaces 2212, 2222 of the metal vias 22 for external connection.

Figure 12:
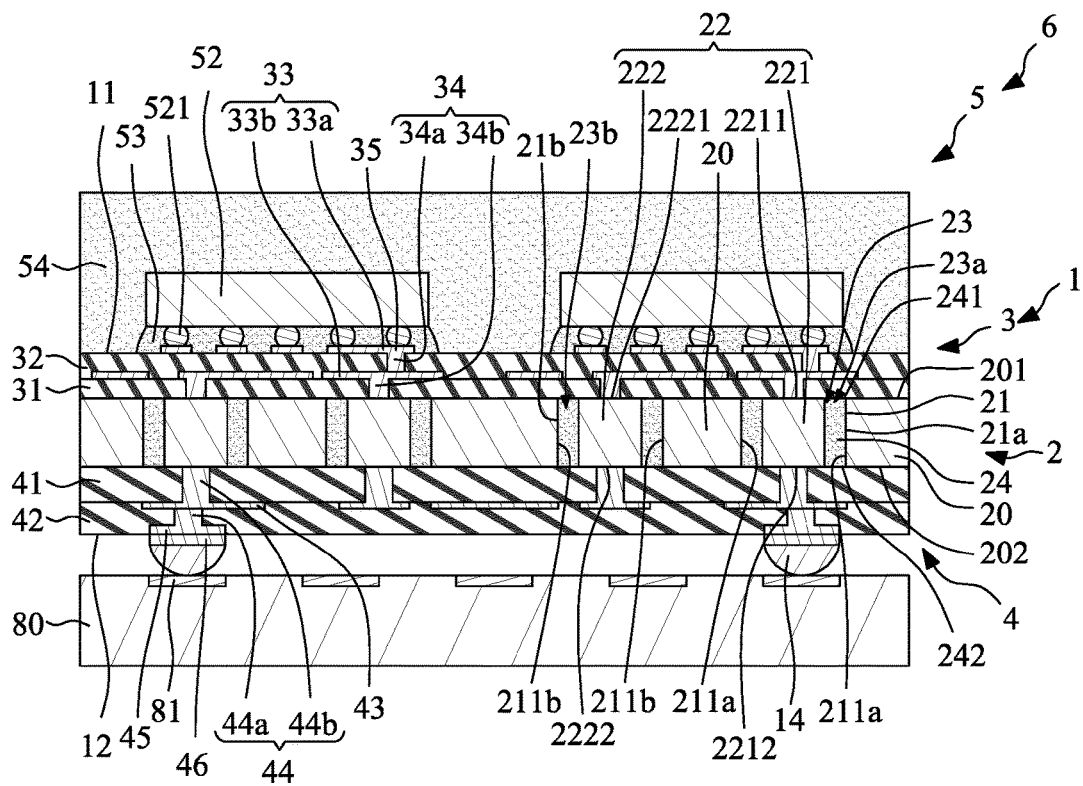
FIG. 12 illustrates a cross-sectional view of a semiconductor package structure according to an embodiment of the present disclosure.

FIG. 12 illustrates a cross-sectional view of a semiconductor package structure 6 according to an embodiment of the present disclosure. The semiconductor package structure 6 of FIG. 12 is similar to the semiconductor package structure 5 in FIG. 10, except that the semiconductor package structure 6 in FIG. 12 is mounted to a substrate 80 or a printed circuit board (PCB) by surface mounting technology (SMT). The substrate 80 may be a core substrate or a coreless substrate, and includes a circuit layer 81. The L/S of the circuit layer 81 is greater than 7 μm/7 μm. The external connection element 14 contacts the circuit layer 81.

Figure 13:
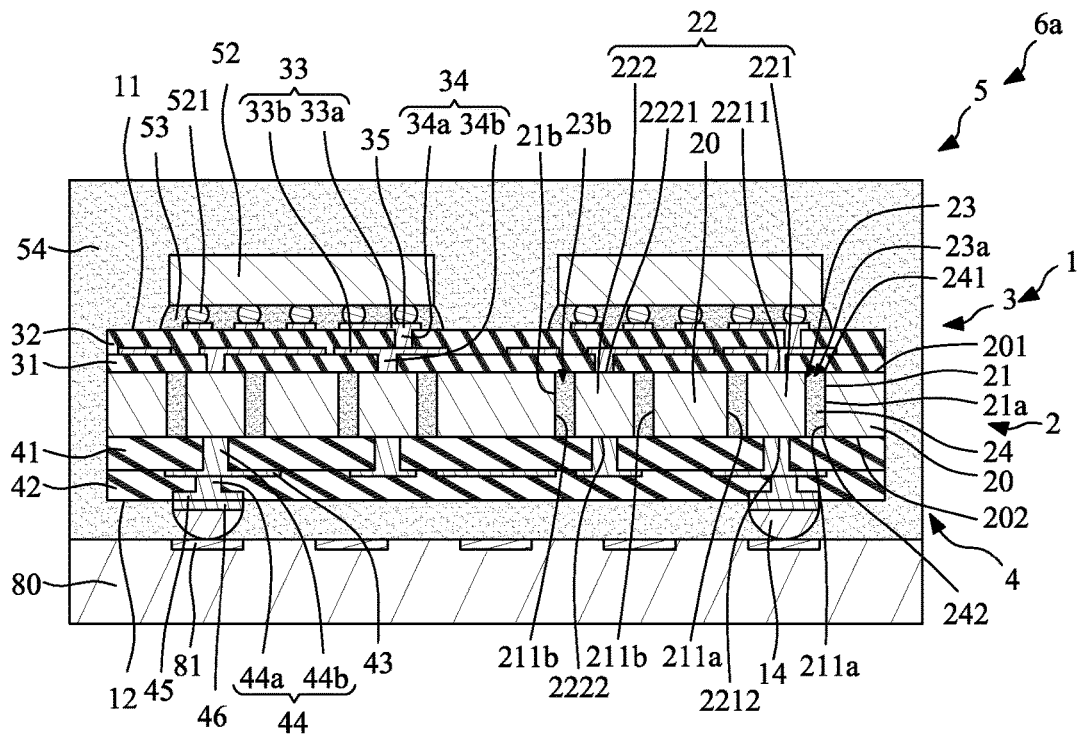
FIG. 13 illustrates a cross-sectional view of a semiconductor package structure according to an embodiment of the present disclosure.

FIG. 13 illustrates a cross-sectional view of a semiconductor package structure 6a according to an embodiment of the present disclosure. The semiconductor package structure 6a of FIG. 13 is similar to the semiconductor package structure 6 as shown in FIG. 12, except that the encapsulant 54 further covers side surfaces of the interposer 1, and further fills a space between the interposer 1 and the substrate 80 to protect the external connection element 14.

Figure 14:
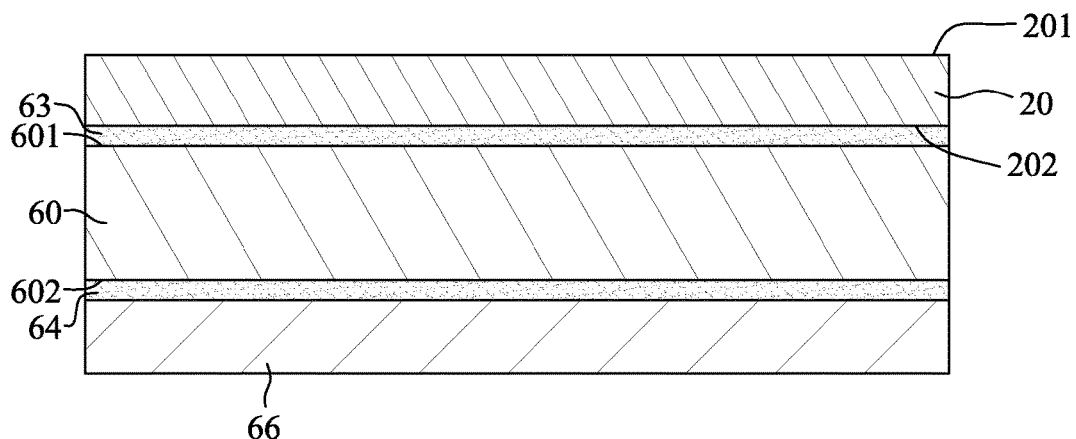
FIG. 14, FIG. 15, FIG. 16, FIG. 17, FIG. 18 and FIG. 19 illustrate a semiconductor process according to an embodiment of the present disclosure.

FIGS. 14-19 illustrate a semiconductor process according to an embodiment of the present disclosure. Referring to FIG. 14, a metal layer 20 is attached on a carrier 60. The carrier 60 has a first surface 601 and a second surface 602. The thickness of the carrier 60 may be about 1 mm. The material of the carrier 60 may be, for example, silicon, glass, metal (e.g., copper or stainless steel), a laminate structure (e.g., FR4) or a resin (e.g., bismaleimide-triazine (BT)). The metal layer 20 is adhered to the first surface 601 of the carrier 60 by a first adhesion material 63. The thickness of the metal layer 20 may be about 3 μm to about 100 μm. A first surface (at a first surface 201 of what will become an interconnection structure 2) and a second surface (at a second surface 202 of what will become the interconnection structure 2) of the metal layer 20 have excellent uniformity (e.g., uniformity less than about 3% and TTV less than about 5 μm), which is an advantage for the formation of an RDL structure described below.

In addition, a reinforced layer 66 is attached (adhered) to the second surface 602 of the carrier 60 by a second adhesion material 64. The reinforced layer 66 can balance a thermal expansion of the metal layer 20 during manufacturing, to avoid warpage of the carrier 60. In one or more embodiments, a material of the reinforced layer 66 is same as a material of the metal layer 20. In one or more embodiments, both the reinforced layer 66 and the metal layer 20 are copper. In one or more embodiments, a thickness of the reinforced layer 66 is same as a thickness of the metal layer 20. In one or more embodiments, both the reinforced layer 66 and the metal layer 20 are copper, and the thickness of the reinforced layer 66 is same as the thickness of the metal layer 20.

In one or more embodiments, the material of the reinforced layer 66 is a non-metal, such as an organic or ceramic material, which is different from the material of the metal layer 20, and the thickness of the reinforced layer 66 is different from the thickness of the metal layer 20. It is noted that, depending on rigidity of the carrier 60, the reinforced layer 66 may be omitted.

Figure 15:
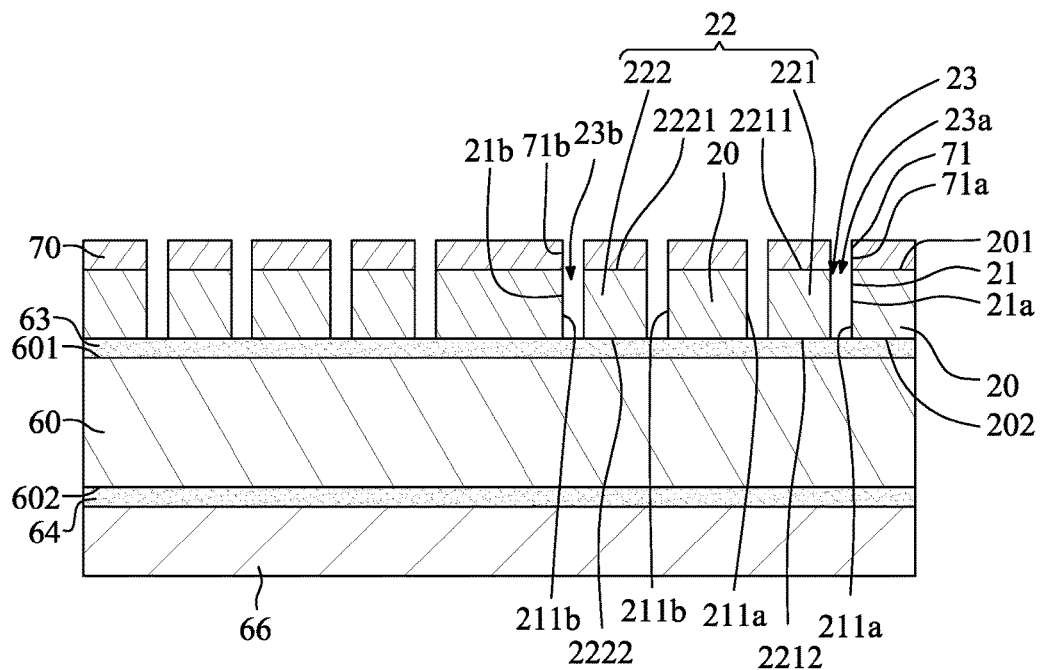

Referring to FIG. 15, a photoresist layer 70 is applied on the metal layer 20 at the first surface 201. Openings 71 (e.g., a first opening 71a and a second opening 71b) are formed in the photoresist layer 70 to expose portions of the metal layer 20. Each of the openings 71 (e.g., the first opening 71a and the second opening 71b) is in a ring shape. Portions of the metal layer 20 exposed by the openings 71 are etched from the first surface 201 to form through holes 21 (e.g., a first through hole 21a and a second through hole 21b) in a ring shape, leaving metal vias 22 (e.g., a first metal via 221 and a second metal via 222), such that each metal via 22 is disposed in a corresponding through hole 21, and there is a space 23 (e.g., a first space 23a and a second space 23b) between the metal via 22 and a side wall (e.g., 211a or 211b) of the through hole 21. That is, the first metal via 221 is disposed in the first through hole 21a, and the first space 23a is between the first metal via 221 and the side wall 211a of the first through hole 21a; and the second metal via 222 is disposed in the second through hole 21b, and the second space 23b is between the second metal via 222 and the side wall 211b of the second through hole 21b.

Because the metal vias 22 (e.g., the first metal via 221 and the second metal via 222) are formed by etching the metal layer 20, the metal layer 20 and the metal vias 22 are a same material; in some embodiments they are both copper. Without any further treatment, first surfaces 2211, 2221 of the metal vias 22 (e.g., respectively the first metal via 221 and the second metal via 222) are substantially coplanar with the surface of the metal layer 20 at the first surface 201, and second surfaces 2212, 2222 of the metal vias 22 (e.g., respectively the first metal via 221 and the second metal via 222) are substantially coplanar with the surface of the metal layer 20 at the second surface 202. It is noted that since the metal vias 22 are formed by etching rather than plating, a surface condition of the first surface 601 of the carrier 60 will not influence a surface condition of the first surfaces 2211, 2221 of the metal vias 22 and the surface of the metal layer 20 at the first surface 201. In addition, after the etching process, the surface of the metal vias 22 along the first surface 201, the first surfaces 2211, 2221 of the metal vias 22, the second surfaces 2212, 2222 of the metal vias 22 and the surface of the metal layer 20 at the second surface 202 retain excellent uniformity (e.g., uniformity less than about 3% and TTV less than about 5 µm).

Figure 16:
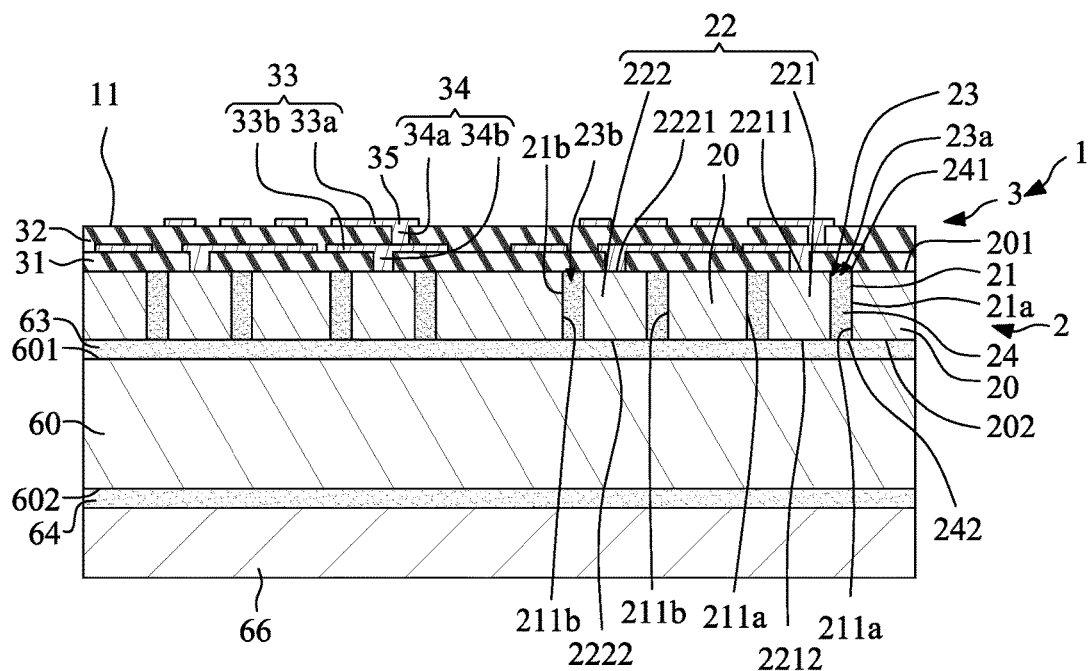

Referring to FIG. 16, an isolation material 24 is filled in the spaces 23 (e.g., the first space 23a and the second space 23b) to form the interconnection structure 2 having the first surface 201 and the second surface 202. A first surface 241 of the isolation material 24 is substantially coplanar with the surface of the metal layer 20 at the first surface 201, and a second surface 242 of the isolation material 24 is substantially coplanar with the surface of the metal layer 20 at the second surface 202. A first RDL 3 is formed on the first surface 201 of the interconnection structure 2 (which includes the first surface 241 of the isolation material 24a and a surface of the metal layer 20). The first RDL 3 is electrically connected to the metal vias 22. In one or more embodiments, the first RDL 3 is further electrically connected to the metal layer 20, such as for grounding. The interconnection structure 2 and the first RDL 3 form the interposer 1 of FIG. 1. The first RDL 3 is formed on an even surface (the first surface 201 including the surface of the metal layer 20 and the first surface 241 of the isolation material 24), thus peeling of the first RDL 3 will not easily occur, and high yield may be obtained. Further, most of the interconnection structure 2 is metal with a relative low CTE, which can prevent warpage of the interposer 1.

It is noted that the first insulation layer 31 (the bottommost insulation layer of the first RDL 3) may extend into and fill the space 23 (e.g., the first space 23a and the second space 23b) to form the isolation material 24 between the metal vias 22 and the side walls 211a, 211b of the through holes 21. That is, in one or more embodiments, a material of the first insulation layer 31 is the same as a material of the isolation material 24, and both are formed concurrently, to obtain the interposer 1a of FIG. 6.

Figure 17:
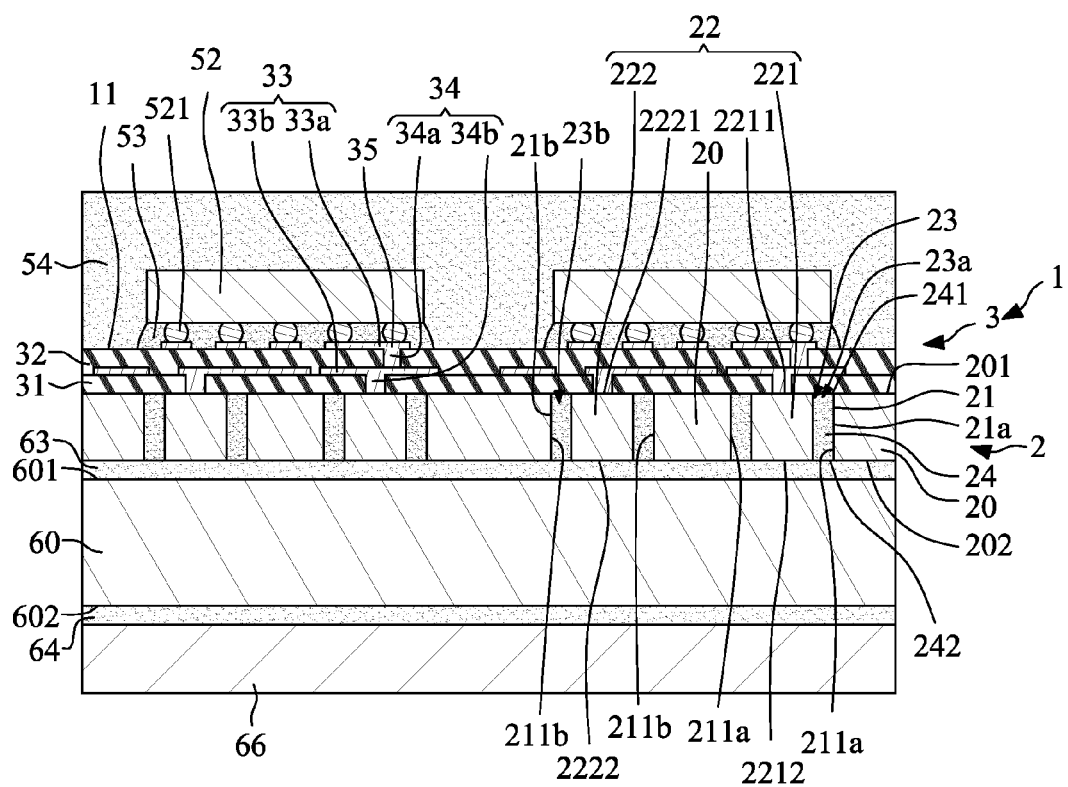

Referring to FIG. 17, at least one semiconductor die 52 is disposed on and electrically connected to the first RDL 3 of the interposer 1. In the embodiment illustrated in FIG. 17, the semiconductor die 52 includes connection elements 521 disposed on and electrically connected to the first pads 35 included in the uppermost circuit layer 33 (e.g., the circuit layer 33a) that is disposed at the first surface 11 of the interposer 1. The connection elements 521 may be, for example, solder balls, bumps or pillars. In other embodiments, the semiconductor die 52 may be electrically connected to the first RDL 3 by wire bonding. An underfill 53 is applied to surround the connection elements 521 and fill under the semiconductor die 52. Then, an encapsulant 54 (e.g., a molding compound) is formed on the first RDL 3 to cover the semiconductor die 52, the underfill 53 and the first surface 11 of the interposer 1. It is noted that the underfill 53 may be omitted, and the encapsulant 54 may further surround the connection elements 521 and fill under the semiconductor die 52.

Figure 18:
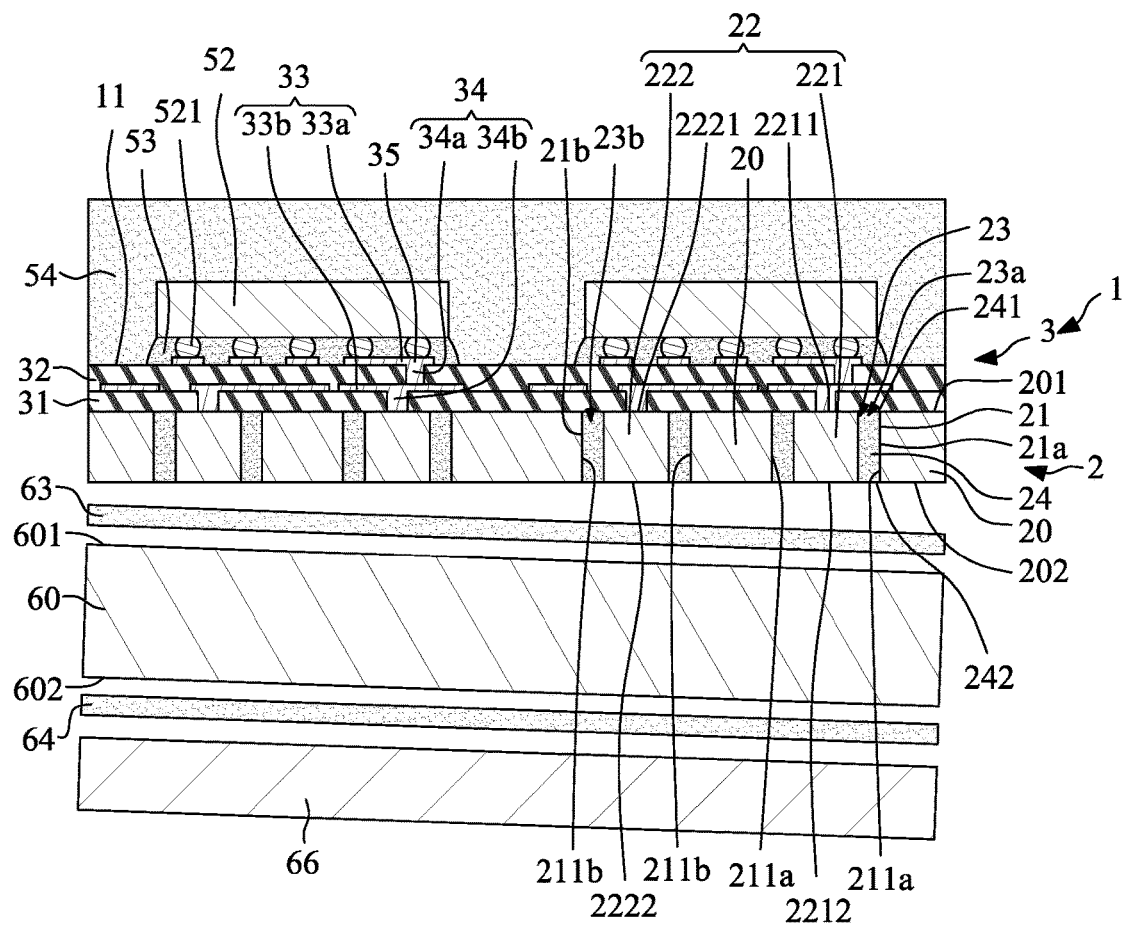

Referring to FIG. 18, the carrier 60, the first adhesion material 63, the reinforced layer 66 and the second adhesion material 64 are separated from the second surface 202 of the interconnection structure 2. In one or more embodiments, a protection layer and external connection elements (e.g., a protection layer 55 and external connection elements 56 as shown in FIG. 11) may be formed on the second surface 202 of the interconnection structure 2.

Figure 19:
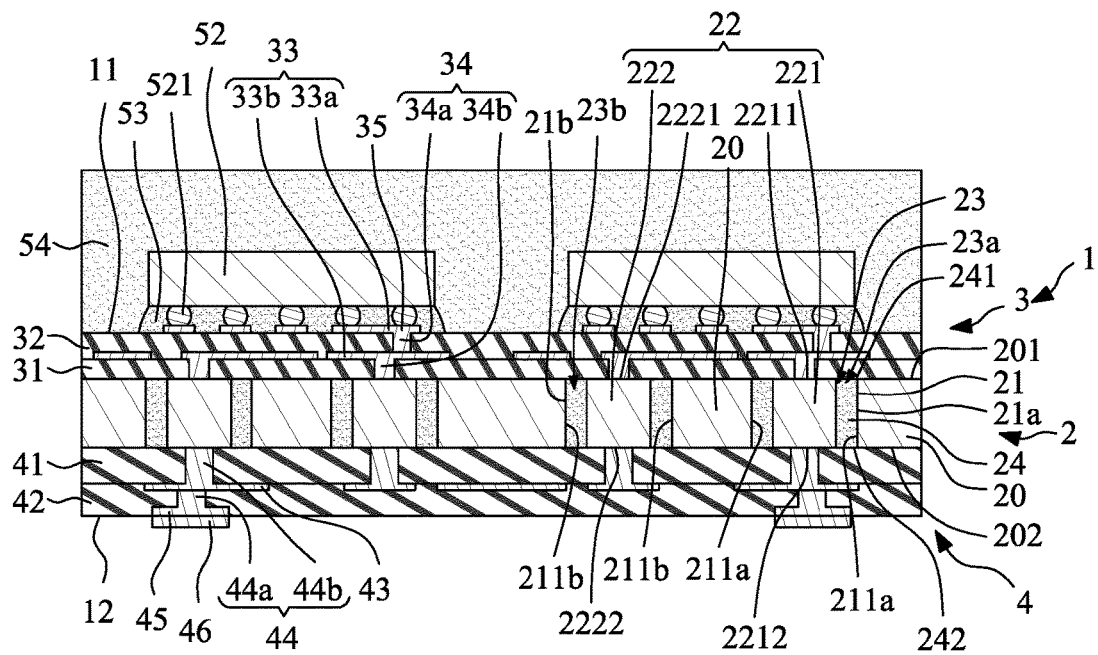

Referring to FIG. 19, a second RDL 4 is formed on the second surface 202 of the interconnection structure 2. The second RDL 4 is electrically connected to the metal vias 22.

The first RDL 3 may be electrically connected to the second RDL 4 through the metal vias 22. In one or more embodiments, the second RDL 4 may be further electrically connected to the metal layer 20, such as for grounding. A surface finish layer 46 is optionally disposed (e.g., plated) on second pads 45 of the second RDL 4.

Connection elements 14 (e.g., solder balls or bumps) may be disposed (not shown in FIG. 19) on the surface finish layer 46 or on respective ones of the second pads 45, to obtain the semiconductor package structure 5 shown in FIG. 10. The semiconductor package structure 5 may be mounted (not shown in FIG. 19) to a substrate 80 or a printed circuit board (PCB) by surface mounting technology (SMT), to obtain the semiconductor package structure 6 shown in FIG. 12.

Figure 20:
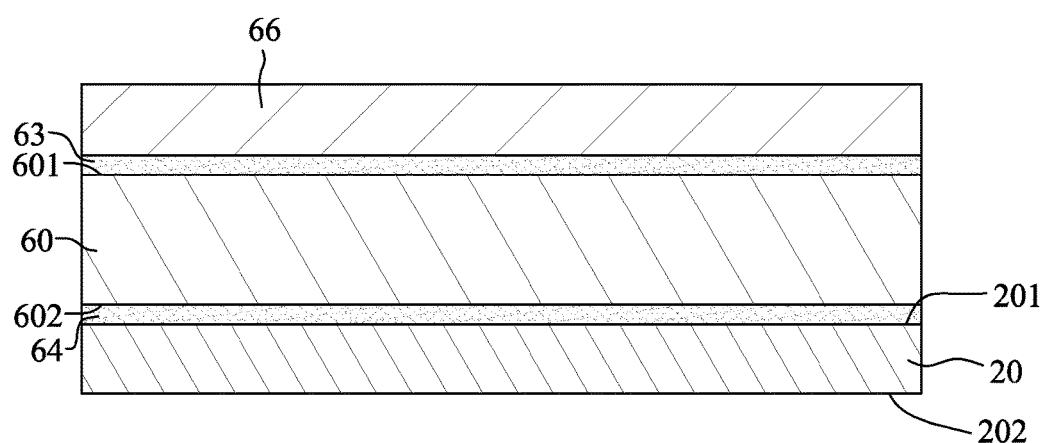
FIG. 20, FIG. 21, FIG. 22, FIG. 23, FIG. 24, FIG. 25 and FIG. 26 illustrate a semiconductor process according to an embodiment of the present disclosure.

FIGS. 20-26 illustrate a semiconductor process according to an embodiment of the present disclosure. Referring to FIG. 20, a metal layer 20 is adhered to a second surface 602 of a carrier 60 by a second adhesion material 64, and a reinforced layer 66 is adhered to a first surface 601 of the carrier 60 by a first adhesion material 63. A surface of the metal layer 20 lies along what will become a first surface 201 of an interconnection structure 2, and another surface of the metal layer 20 lies along what will become a second surface 202 of the interconnection structure 2.

Figure 21:
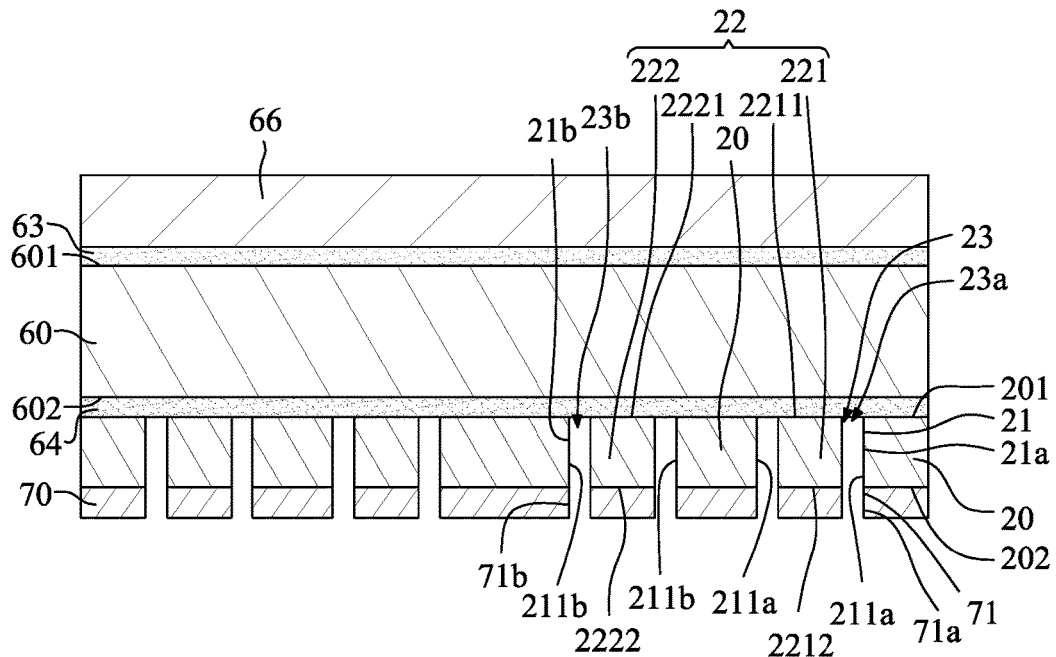

Referring to FIG. 21, a photoresist layer 70 is applied on the metal layer 20 at the second surface 202. Openings 71 (e.g., a first opening 71a and a second opening 71b) are formed in the photoresist layer 70 to expose portions of the metal layer 20 at the second surface 202. Each of the openings 71 (e.g., the first opening 71a and the second opening 71b) is in a ring shape. Then, the portions of the metal layer 20 exposed at the second surface 202 by the openings 71 are etched from the metal layer 20, so as to form through holes 21 (e.g., a first through hole 21a and a second through hole 21b) and leave metal vias 22 (e.g., a first metal via 221 and a second metal via 222). The metal vias 22 are thus disposed in respective through holes 21, and a space 23 (e.g., a first space 23a and a second space 23b) is between the metal vias 22 and side walls 211a or 211b of the through holes 21. That is, the first metal via 221 is disposed in the first through hole 21a, and the first space 23a is between the first metal via 221 and the side wall 211a of the first through hole 21a; and the second metal via 222 is disposed in the second through hole 21b, and the second space 23b is between the second metal via 222 and the side wall 211b of the second through hole 21b. The first metal via 221 has a first surface 2211 and a second surface 2212. The second metal via 222 has a first surface 2221 and second surface 2222.

Figure 22:
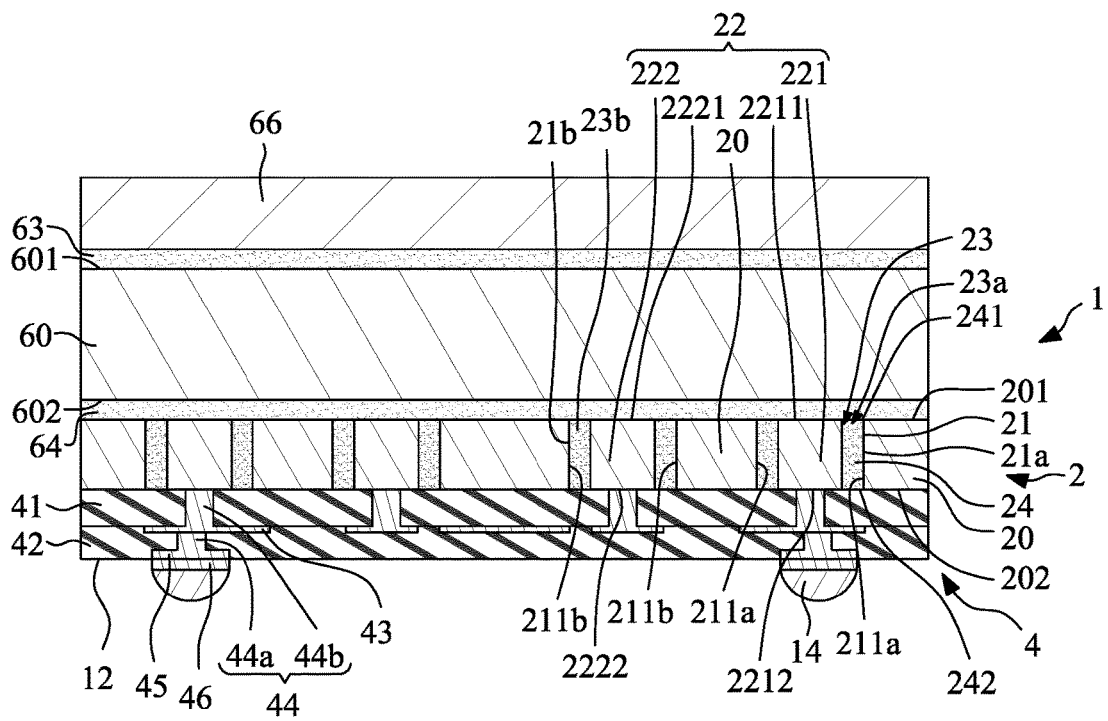

Referring to FIG. 22, an isolation material 24 is filled in the spaces 23 (e.g., the first space 23a and the second space 23b) to form the interconnection structure 2 having the first surface 201 and the second surface 202. A first surface 241 of the isolation material 24 is substantially coplanar with the surface of the metal layer 20 at the first surface 201 of the interconnection structure 2, and a second surface 242 of the isolation material 24 is substantially coplanar with the surface of the metal layer 20 at the second surface 202 of the interconnection structure 2. A second RDL 4 is formed on the second surface 202 of the interconnection structure 2. The interconnection structure 2 and the second RDL 4 form an interposer 1. A surface finish layer 46 is optionally disposed (e.g., plated) on pads 45 of the second RDL 4. At least one external connection element 14 (e.g., solder balls or bumps) is formed on the surface finish layer 46 or on the second pads 45.

It is noted that a separate isolation material 24 may be omitted, and instead a first insulation layer 41 (e.g., an insulation layer of the second RDL 4 closest to the interconnection structure 2) may extend into and fill the spaces 23 (e.g., the first space 23a and the second space 23b) to form the isolation material 24 between the metal vias 22 and the side walls 211a, 211b of the through holes 21. That is, in one or more embodiments, a material of the first insulation layer 41 is the same as a material of the isolation material 24, and the first insulation layer 41 and the isolation material 24 are formed concurrently.

Figure 23:
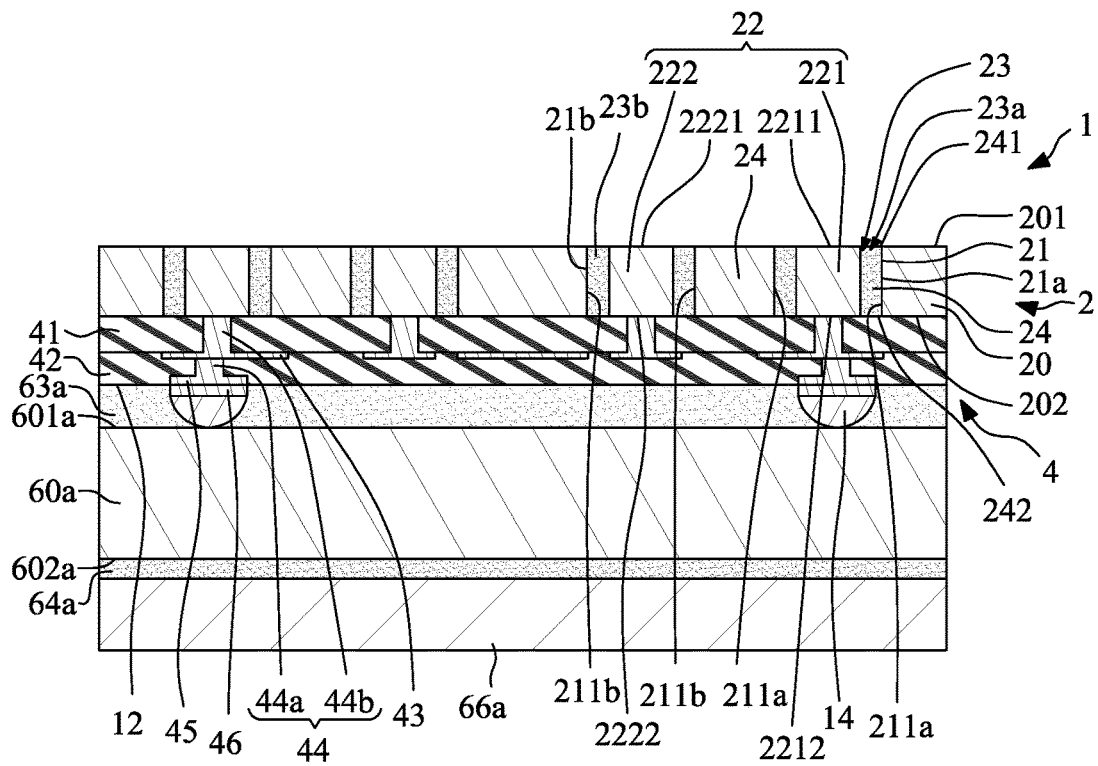

Referring to FIG. 23, a supporting structure 60a is attached to the second RDL 4. A second surface 12 of the interposer 1 (e.g., a surface of a second insulation layer 42 of the RDL 4) is adhered to a first surface 601a of the supporting structure 60a by a first adhesion material 63a, and a second reinforced layer 66a is adhered to a second surface 602a of the supporting structure 60a by a second adhesion material 64a. The supporting structure 60a covers the external connection element 14 and supports the interconnection structure 2. The supporting structure 60a and the second reinforced layer 66a may be similar to the carrier 60 and the reinforced layer 66 of FIG. 22, respectively. Then, the carrier 60, the first adhesion material 63, the reinforced layer 66 and the second adhesion material 64 are separated from the interconnection structure 2.

Figure 24:
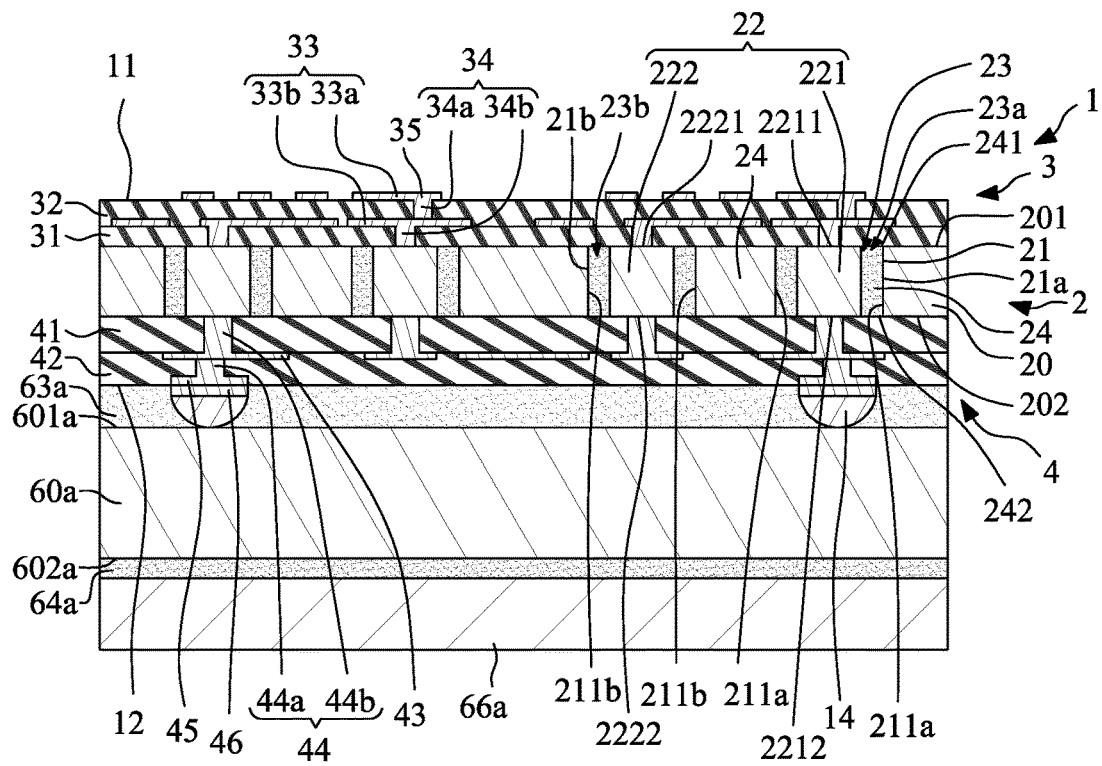

Referring to FIG. 24, a first RDL 3 is formed on the first surface 201 of the interconnection structure 2. The first RDL 3 is electrically connected to the metal vias 22. In one or more embodiments, the first RDL 3 may be further electrically connected to the metal layer 20, such as for grounding.

Figure 25:
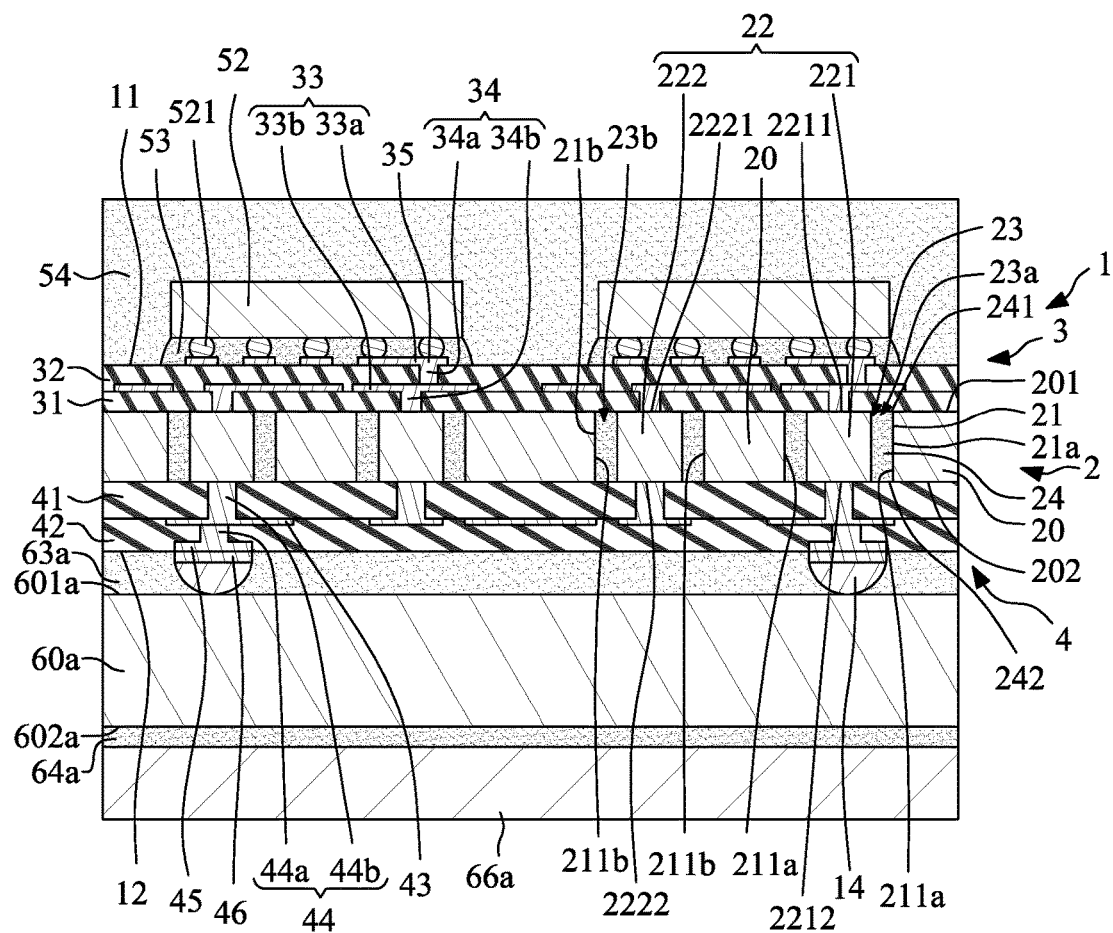

Referring to FIG. 25, a semiconductor die 52 is disposed on and electrically connected to the first RDL 3. The semiconductor die 52 includes connection elements 521 (e.g., solder balls, bumps or pillars) disposed on and electrically connected to first pads 35 included in an uppermost circuit layer 33 (e.g., the circuit layer 33a) of the RDL 3. In other embodiments, the semiconductor die 52 may be electrically connected to the first RDL 3 by wire bonding. An underfill 53 is applied to surround the connection elements 521 and to fill under the semiconductor die 52. Then, an encapsulant 54 (e.g., a molding compound) is formed on the first RDL 3 to cover the semiconductor die 52, the underfill 53 and the first surface 11 of the interposer 1. In one or more embodiments, the underfill 53 is omitted, and the encapsulant 54 further surrounds the connection elements 521 and fills under the semiconductor die 52.

Figure 26:
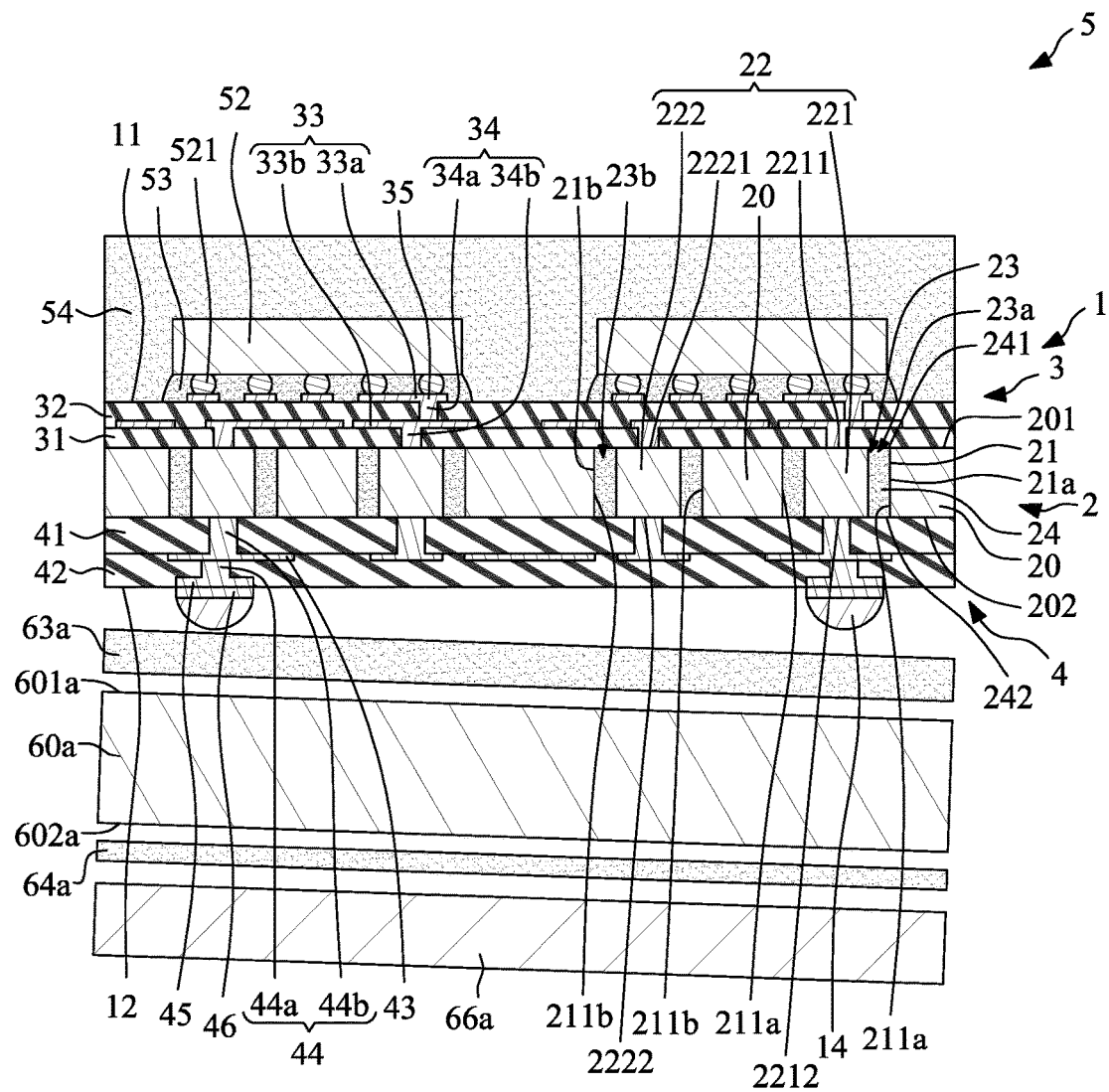

Referring to FIG. 26, the supporting structure 60a, the first adhesion material 63a, the second reinforced layer 66a and the second adhesion material 64a are separated from the second RDL 4 to form the semiconductor package structure 5 of FIG. 10.

The semiconductor package structure 5 may be mounted to a substrate or a printed circuit board (PCB) by surface mounting technology (SMT) to obtain the semiconductor package structure 6 shown in FIG. 12.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than about 5 µm, no greater than about 2 µm, no greater than about 1 µm, or no greater than about 0.5 µm.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor process, comprising:
   (a) attaching a metal layer on a carrier;
   (b) removing a portion of the metal layer to form a through hole and at least one metal via, wherein the at least one metal via is disposed in the through hole, and the at least one metal via is separated from a side wall of the through hole by a space;

(c) forming a first redistribution layer on a first surface of the metal layer, wherein the first redistribution layer is electrically connected to the at least one metal via;

(d) attaching a semiconductor die on the first redistribution layer;

(e) separating the carrier from the metal layer;

(f) forming a second redistribution layer on a second surface of the metal layer; and (g) forming at least one external connection element on the second redistribution layer.

2. The semiconductor process of claim 1, wherein in (a), the metal layer is adhered to the carrier, and in (b) the portion of the metal layer is removed by etching.

3. The semiconductor process of claim 1, wherein in (b), the at least one metal via tapers.

4. The semiconductor process of claim 1, wherein in (b), the at least one metal via disposed in the through hole is a single metal via disposed in the through hole, and the space has a ring shape from a top view and surrounds the metal via.

5. The semiconductor process of claim 1, wherein in (b), the at least one metal via disposed in the through hole is a plurality of metal vias disposed in the through hole, and the metal vias are spaced apart from each other.

6. The semiconductor process of claim 1, wherein in (b), the metal via curves inward towards a first surface of the metal via and curves inward or outward towards a second surface of the metal via, the second surface of the metal via being opposite to the first surface of the metal via.

7. The semiconductor process of claim 1, wherein after (b), the semiconductor process further comprises:

(b 1) filling an isolation material in the space.

8. The semiconductor process of claim 7, wherein in (b 1), a first surface of the isolation material is substantially coplanar with the first surface of the metal layer, and a second surface of the isolation material is substantially coplanar with the second surface of the metal layer.

9. The semiconductor process of claim 1, wherein in (c), the first redistribution layer is further electrically connected to the metal layer.

10. The semiconductor process of claim 1, wherein forming the first redistribution layer in (c) includes forming an insulation layer on the metal layer, the insulation layer extending into the space to form an isolation material between the at least one metal via and the side wall of the through hole.

11. The semiconductor process of claim 10, wherein in (c), a first surface of the isolation material is substantially coplanar with the first surface of the metal layer, and a second surface of the isolation material is substantially coplanar with the second surface of the metal layer.

12. The semiconductor process of claim 1, wherein after (d), the semiconductor process further comprises:

(d 1) forming an encapsulant on the first redistribution layer to cover the semiconductor die.

13. The semiconductor process of claim 1, wherein in (f), the first redistribution layer is electrically connected to the second redistribution layer through the at least one metal via.

14. The semiconductor process of claim 13, wherein in (f), the second redistribution layer is further electrically connected to the metal layer.

15. A semiconductor process, comprising:

(a) attaching a metal layer on a carrier;

(b) removing a portion of the metal layer to form a through hole and at least one metal via, wherein the at least one metal via is disposed in the through hole, and the at least one metal via is separated from a side wall of the through hole by a space;

(c) forming a first redistribution layer on a first surface of the metal layer, wherein the first redistribution layer is electrically connected to the at least one metal via;

(d) forming a second redistribution layer on a second surface of the metal layer;

(e) attaching a supporting structure on the second redistribution layer;

(f) separating the carrier from the metal layer;

(g) attaching a semiconductor die on the first redistribution layer; and (h) separating the supporting structure from the second redistribution layer.

16. The semiconductor process of claim 15, wherein in (d), the first redistribution layer is electrically connected to the second redistribution layer through the at least one metal via.

17. The semiconductor process of claim 16, wherein in (d), the second redistribution layer is further electrically connected to the metal layer.

18. The semiconductor process of claim 15, wherein after (d), the semiconductor process further comprises:

(d 1) forming at least one external connection element on the second redistribution layer, and wherein in (e), the supporting structure covers the external connection element.

19. The semiconductor process of claim 15, wherein after (g), the semiconductor process further comprises:

(g 1) forming an encapsulant on the first redistribution layer to cover the semiconductor die.

* * * * *